(12) United States Patent
Sunamura et al.

(10) Patent No.: US 8,283,732 B2
(45) Date of Patent: Oct. 9, 2012

(54) SEMICONDUCTOR DEVICE

(75) Inventors: Hiroshi Sunamura, Kanagawa (JP);
Kouji Masuzaki, Kanagawa (JP)

(73) Assignee: Renesas Electronics Corporation,
Kawasaki-Shi, Kanagawa (JP)

( * ) Notice: Subject to any disclaimer, the term of this patent is extended or adjusted under 35 U.S.C. 154(b) by 386 days.

(21) Appl. No.: 12/588,039

(22) Filed: Oct. 1, 2009

(65) Prior Publication Data

US 2010/0084716 A1    Apr. 8, 2010

(30) Foreign Application Priority Data

Oct. 2, 2008 (JP) ................................ 2008-257038

(51) Int. Cl.
H01L 29/76 (2006.01)
H01L 29/94 (2006.01)
H01L 31/062 (2012.01)
H01L 31/113 (2006.01)
H01L 31/119 (2006.01)

(52) U.S. Cl. .................... 257/388; 257/412; 257/413

(58) Field of Classification Search .............. 257/388, 257/407, 412, 413
See application file for complete search history.

(56) References Cited

U.S. PATENT DOCUMENTS 7,859,059 B2 * 12/2010 Takahashi .............. 257/369
2008/0303099 A1 * 12/2008 Iwamoto et al. .......... 257/369

OTHER PUBLICATIONS

Kim, et al., "Systematic Study of Workfunction Engineering and Scavenging Effect Using NiSi Alloy FUS Metal Gates with Advanced Gate Stacks", International Electron Devices Meeting Technical Digest, 05-657, Session 27, pp. 27.6.1-27.6.4., 2005.
Takahashi, et al., "Dual Workfunction Ni-Silicide/HfSiON Gate Stacks by Phase-Controlled Full-Silicidation (PC-FUSI) Technique for 45nm-node LSTP and LOP Devices", International Electron Devices Meeting Technical Digest, IEEE, 4 pages, 2004.
Kedzierski, et al., "Threshold voltage control in NiSi-gated MOSFETs through silicidation induced impurity segregation (SIIS)", International Electron Devices Meeting Technical Digest, 4 pages, 2003.
Kedzierski, et al., "Metal-gate FinFET and fully-depleted SOI devices using total gate silicidation", International Electron Devices Meeting Technical Digest, 4 pages, 2002.
Lee, et al., "Tunable Work Function Dual Metal Gate Technology for Bulk and Non-Bulk CMOS", International Electron Devices Meeting Technical Digest, 4 pages, 2002.

* cited by examiner

*Primary Examiner* — Thien F Tran
(74) *Attorney, Agent, or Firm* — McGinn IP Law Group, PLLC

(57) ABSTRACT

Provided is a semiconductor device including a substrate, a gate insulating film which is formed on the substrate, and a gate electrode which is provided on the gate insulating film. The gate electrode includes a first metal silicide including a first metal material, and a second metal silicide including one of a second metal material and the second metal material in a contact portion between the gate insulating film and the gate electrode. The second metal silicide including the second metal material is a metal-rich silicide in which the composition ratio of the second metal material to silicon in the second metal silicide including the second metal is greater than 1.

22 Claims, 16 Drawing Sheets

FIG. 12A  N-TYPE MOSFET  17  P-TYPE MOSFET  15
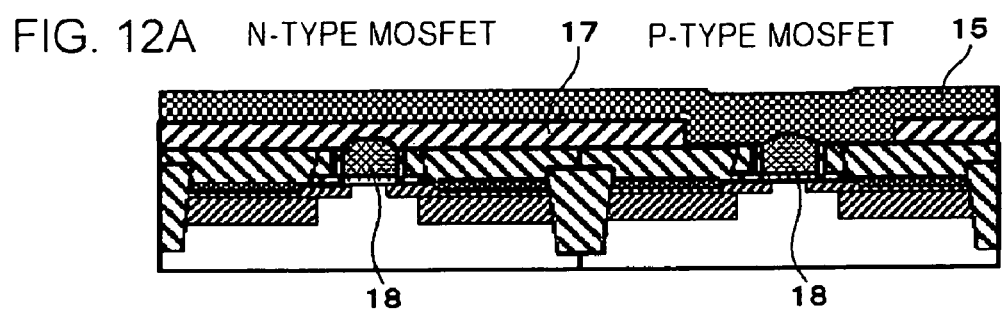
FIG. 12B
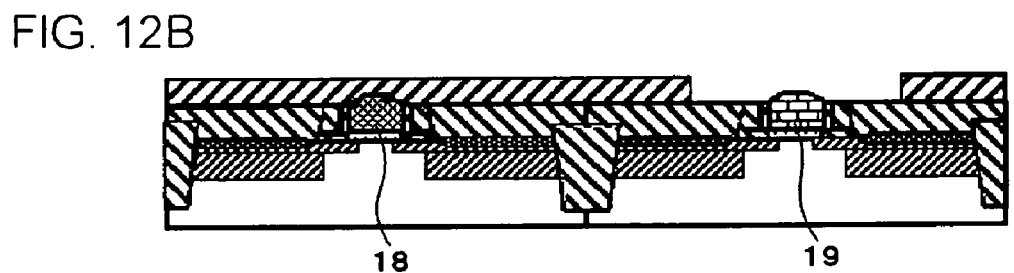
FIG. 12C
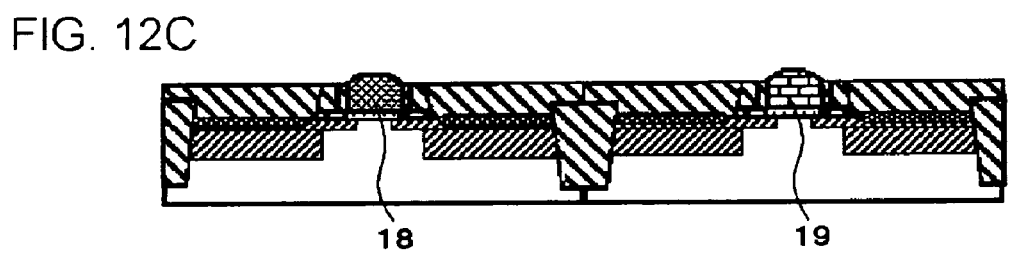

FIG. 16A

N-TYPE MOSFET   17   P-TYPE MOSFET   15
14
27   27

N-TYPE MOSFET        P-TYPE MOSFET

N-TYPE MOSFET        P-TYPE MOSFET

N-TYPE MOSFET    P-TYPE MOSFET

N-TYPE MOSFET    P-TYPE MOSFET

SEMICONDUCTOR DEVICE

This application is based on Japanese patent application No. 2008-257038, the content of which is incorporated hereinto by reference.

BACKGROUND

1. Technical Field

The present invention relates to a semiconductor device.

2. Related Art

In the development of an advanced CMOS (complementary MOS) device having a small size, a driving current deteriorates due to the depletion of a polysilicon (poly-Si) electrode and a gate leakage current is increased due to a reduction in the thickness of a gate insulating film. Therefore, a composite technique has been examined in which a metal gate electrode is used to prevent the depletion of the electrode and a gate insulating film is made of a high-dielectric-constant material to increase a physical thickness, thereby reducing the gate leakage current.

For example, a pure metal, a metal nitride, or a silicide material has been examined as a material forming the metal gate electrode. However, in all the cases, the threshold voltages (Vth) of an N-type MOSFET and a P-type MOSFET need to be set to appropriate values.

In order to obtain a threshold voltage Vth of ±0.5 eV or less in the CMOS transistor, the gate electrode of the N-type MOSFET needs to be made of a material having a work function that is equal to or less than the mid-gap (4.6 eV) of a Si, preferably, 4.4 eV, and the gate electrode of the P-type MOSFET needs to be made of a material having a work function that is equal to or more than the mid-gap (4.6 eV) of a Si, preferably, 4.8 eV.

In order to achieve the above, a method has been proposed in which different kinds of metal materials or alloys having different work functions are used for the electrodes of the N-type MOSFET and the P-type MOSFET to control the threshold values of the transistors (dual metal gate technique). For example, as a first related art, in International electron devices meeting technical digest, 2002, p. 359, is disclosed a structure in which the work functions of a Ta electrode 23 and a Ru electrode 24 formed on a $SiO_2$ film 20 are 4.15 eV and 4.95 eV, respectively, and a work function of 0.8 eV between the two electrodes can be modulated, as shown in FIG. 17A.

In recent years, a technique related to a silicide electrode obtained by completely siliciding a poly-Si electrode with, for example, Ni, Hf, or W has drawn attention. For example, as a second related art, in International electron devices meeting technical digest, 2002, p. 247 and International electron devices meeting technical digest, 2003, p. 315, is disclosed a technique in which the $SiO_2$ film 20 is used as a gate insulating film, Ni silicide electrodes (a P-doped NiSi electrode 25 and a B-doped NiSi electrode 26) obtained by completely siliciding a poly-Si electrode doped with impurities, such as P or B, with Ni are used as gate electrodes, and the work functions of the electrodes are modulated by a maximum of 0.5 eV, as shown in FIG. 17B. This technique has characteristics that, after a high-temperature heat treatment is performed to activate the impurities of a source/drain diffusion layer 9 of the CMOS, it is possible to silicide the poly-Si electrode. This technique is well matched with the CMOS process according to the related art. In addition, in International electron devices meeting technical digest, 2002, p. 247 and International electron devices meeting technical digest, 2003, p. 315, when a SiON film is used as the gate insulating film, the work functions of NiSi and $NiSi_2$ for the gate electrodes are about 4.6 eV and 4.45 eV, respectively.

In the second related art, the gate insulating film is the $SiO_2$ film 20 or the SiON film. However, a technique for combining the technique that uses the high-dielectric-constant insulating film as the gate insulating film to reduce the leakage current with a metal gate technique is also important. As a third related art, in International electron devices meeting technical digest, 2004, p. 91, is disclosed a method that makes the contents of Ni of the Ni silicide electrodes in the N-type MOSFET and the P-type MOSFET different from each other to obtain work functions required for the N-type MOSFET and the P-type MOSFET. For example, a technique has been proposed in which a HfSiON film 21 is used as a gate insulating film and Ni silicide electrodes (a NiSi or $NiSi_2$ electrode 27 or NiSi is used in the N-type MOSFET and a $Ni_3Si$ electrode 28 is used in the P-type MOSFET) including different amounts of Ni are used as the gate electrodes to modulate the work functions of the electrodes by a maximum of 0.4 eV, as shown in FIG. 18A.

In addition, a technique has been proposed which increases the modulation width of the work function using a Ni silicide gate electrode on a high-dielectric-constant gate insulating film as a base. For example, as a fourth related art, in International electron devices meeting technical digest, 2005, session 27, p. 6, is disclosed a technique in which a $HfO_2$ film 22 is used as a gate insulating film and gate electrodes obtained by adding different kinds of metal materials or the silicides thereof to Ni silicide (an Al-added NiSi electrode 29 is used in the N-type MOSFET and a NiPtSi electrode 30 is used in the P-type MOSFET) are used, thereby obtaining a work function of 4.2 to 4.3 eV in the N-type MOSFET and a work function of 4.85 eV in the P-type MOSFET, as shown in FIG. 18B.

SUMMARY

The inventors have developed a gate electrode of a semiconductor device and have conducted various examinations on the improvement of the performance of the semiconductor device. The examination results proved that the transistor according to the fourth related art (International electron devices meeting technical digest, 2005, session 27, p. 6) did not have a sufficiently low operating power and a sufficiently low threshold voltage.

In one embodiment, there is provided a semiconductor device including: a substrate; a gate insulating film which is formed on the substrate; and a gate electrode which is provided on the gate insulating film. The gate electrode includes a first metal silicide including a first metal material, and a second metal silicide including a second metal material, and the second metal material in a contact portion between the gate insulating film and the gate electrode. The second metal silicide including the second metal material is a metal-rich silicide in which the composition ratio of the second metal material to silicon in the second metal silicide including the second metal is greater than 1.

In another embodiment, there is provided a method of manufacturing a semiconductor device including: forming a polysilicon layer on a substrate with a gate insulating film interposed therebetween; patterning the polysilicon layer; and forming a metal layer including a first metal film and a second metal film on the polysilicon film and performing a heat treatment on the metal layer at a predetermined temperature to form a gate electrode including a first metal silicide including a first metal material, and a second metal silicide including a second metal material, and the second metal material in a contact portion between the gate insulating film and the polysilicon film. The second metal silicide including the second metal material is a metal-rich silicide in which the composition ratio of the second metal material to silicon in the second metal silicide including the second metal is greater than 1.

In still another embodiment, there is provided a method of manufacturing a semiconductor device including: forming a polysilicon layer on a substrate with a gate insulating film interposed therebetween; patterning the polysilicon film; forming a first metal layer including a first metal film on the polysilicon film and performing a heat treatment on the first metal layer at a predetermined temperature to form a gate electrode including a first metal silicide including a first metal material in a contact portion between the gate insulating film and the polysilicon film; removing the first metal film; and patterning a hard mask to expose a desired region on the gate electrode, forming a second metal layer including a second metal film on the gate electrode, and performing a heat treatment on the second metal layer at a predetermined temperature to form a gate electrode including a second metal silicide containing a second metal material, and the second metal material in a contact portion between the gate insulating film and the gate electrode. The second metal silicide including the second metal material is a metal-rich silicide in which the composition ratio of the second metal material to silicon in the second metal silicide including the second metal is greater than 1.

In yet another embodiment, there is provided a method of manufacturing a semiconductor device including: forming a polysilicon layer on a substrate with a gate insulating film interposed therebetween; patterning the polysilicon film; forming a first metal layer including a first metal film on the polysilicon film and performing a heat treatment on the first metal layer at a predetermined temperature to form a gate electrode including a first metal silicide containing a first metal material in a contact portion between the gate insulating film and the polysilicon film; removing the first metal film; and patterning a hard mask to expose a desired region on the gate electrode, forming a second metal layer including a second metal film and the first metal film in this order on the gate electrode, and performing a heat treatment on the second metal layer at a predetermined temperature to form a gate electrode including the first metal silicide containing the first metal material, and a second metal silicide containing a second metal material, and the second metal material in a contact portion between the gate insulating film and the gate electrode. The second metal silicide including the second metal material is a metal-rich silicide in which the composition ratio of the second metal material to silicon in the second metal silicide including the second metal material is greater than 1.

According to the above-mentioned embodiments of the invention, there are two kinds of metal materials in the gate electrode, and one of the two kinds of metal materials reacts with silicon, and the other metal material stably exists as metal or metal-rich silicide. Therefore, it is possible to control the work function to a desired value.

According to the above-mentioned embodiments of the invention, it is possible to provide a semiconductor device capable of increasing the work function of the gate electrode on the gate insulating film and having a low threshold voltage.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 12A to 12C are cross-sectional views illustrating a portion of the process of manufacturing the semiconductor device according to the third embodiment of the invention;

FIGS. 16A to 16C are cross-sectional views illustrating a portion of the process of manufacturing the semiconductor device according to the fourth embodiment of the invention;

DETAILED DESCRIPTION

Figure 1:
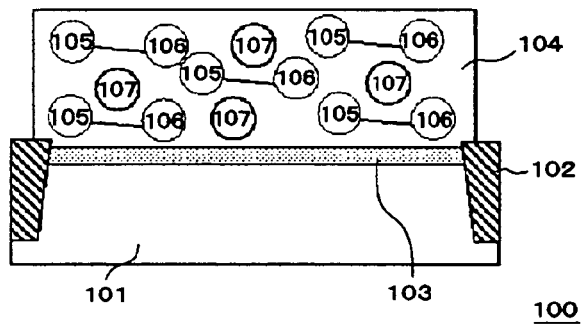
FIG. 1 is a cross-sectional view illustrating the structure of a semiconductor device according to an embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The inventors have examined the structure of a metal gate electrode of a semiconductor device with high performance and a method of manufacturing the same. In particular, the inventors have concentrated on reducing a transistor threshold value of a P-type MOSFET. Hereinafter, exemplary embodiments of the invention will be described with reference to the accompanying drawings. In the drawings, the same components are denoted by the same reference numerals, and a description thereof will not be repeated.

The inventors pay attention to a method of using a gate electrode made of Ni silicide containing various kinds of metal materials, which has been described in the fourth related art. The P-type MOSFET according to the fourth related art is made of NiPtSi (nickel platinum silicide) including a large amount of Ni. However, even when the method according to the fourth related art is used, particularly, even in the P-type MOSFET, a work function is increased by at most +0.25 eV from the mid-gap (4.6 eV) of Si, that is, at most up to about 4.85 eV. The work function is not sufficient to improve the performance of a transistor for LOP and a low threshold voltage.

The inventors pay attention to the silicidation of Pt in the structure disclosed in the fourth related art. Some structures for the work function of Pt silicide on a high-dielectric-constant insulating film have been proposed, in which the work function is at most about 4.9 eV. That is, the work function is not more than 4.9 eV regardless of the amount of Pt silicide mixed with Ni silicide.

Therefore, the inventors considered that it was important not to generate Pt silicide in order to reflect a high work function of Pt (5.65 eV) to the work function of a metal gate electrode. That is, it is possible to achieve a high work function in the following case: silicon and two kinds of metal materials capable of being silicided are included in a gate electrode; one of the two metal materials capable of being silicided is a first metal silicide including a first metal material; and the other metal material (in this case, Pt) is a second metal silicide including a second metal material, which is a metal-rich silicide in which the composition ratio of the second metal to silicon is greater than 1, or the second metal material.

FIG. 1 is a diagram illustrating the outline of the structure of a semiconductor device according to an embodiment of the invention. A semiconductor device 100 includes a silicon substrate 101, an element isolation region 102, a gate insulating film 103, and a gate electrode 104 formed on the silicon substrate 101, and silicon atoms 105 and two kinds of metal materials capable of being silicided which are provided at least in a contact portion between the gate insulating film 103 and the gate electrode 104. In this case, of the two kinds of metal materials capable being silicided, a first metal atom 106 is included as a silicided first metal material, and a second metal atom 107 is included as a second metal material or metal-rich silicide. In this case, in the metal-rich silicide, it is preferable that the composition ratio of the second metal material to silicon in the second metal silicide including the second metal material be equal to or greater than 3.

Figure 2A:
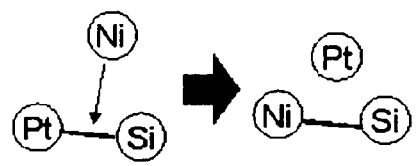
FIG. 2A is a diagram schematically illustrating how to obtain a high work function in the semiconductor device according to the embodiment of the invention.

As an effective method for obtaining the structure shown in FIG. 1, the following is considered: when a second metal material (Pt) and a first metal material (Ni) are simultaneously diffused into silicon to form silicide and Ni more stably forms silicide with Si, Ni is preferentially coupled to Si even when Pt has been coupled to Si; and Pt stably exists as the second metal material in the silicide of the first metal material (FIG. 2A). In addition, it is considered that Pt stably exists as silicide including the second metal material, which is metal-rich silicide. A metal material having low silicide generation energy is used to more stably form silicide. The metal material having low silicide generation energy is silicided easier than a metal material having energy higher than the silicide generation energy.

The point of this embodiment is based on the findings that the first metal material is used as Ni, Ni silicide having generation energy higher than that of Pt silicide stably exists in a thermodynamically stable state, and Pt exists as metal Pt rather than as silicide. Therefore, the inventors have examined a method of depositing Ni and Pt and heat treatment conditions. The examination results proved that, when Si was preferentially coupled to Ni, that is, the composition ratio of Ni to Si was high and a silicidation temperature was high, Pt was not silicided but existed as metal, and a work function of more than 4.9 eV was achieved.

Figure 2B:
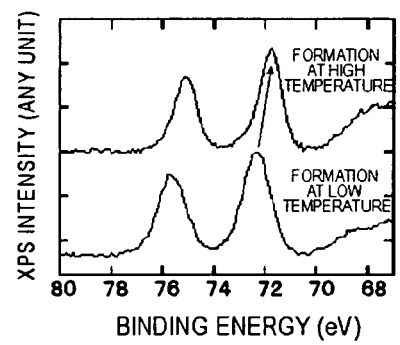
FIG. 2B is a diagram illustrating X-ray photoelectron spectroscopy results and shows Pt existing in a metallic state in the semiconductor device according to the embodiment of the invention.

FIG. 2B shows an X-ray photoelectron spectrum caused by Pt in a Pt-containing Ni silicide electrode according to the following embodiment. As can be seen from FIG. 2, peaks are disposed close to metal Pt, unlike PtSi or $Pt_2Si$, which is a general silicide composition. This shows that Pt is included in the Ni silicide in a non-silicided state or a Pt-rich silicide state. This structure is not obtained from the silicide of a general deposition film made of only Pt, or a NiPtSi deposition film. In order to obtain the structure, it is necessary to increase the silicidation temperature to obtain a sufficiently thermodynamically stable state. As can be seen from the X-ray photoelectron spectrum shown in FIG. 2B, as the silicidation temperature is increased, binding energy is shifted to a low-level side and the binding energy of Pt silicide is closer to the binding energy of Pt.

The document "Properties of Metal Silicides, IEE, 1995" shows that, while the generation energies of $Ni_3Si$, $Ni_2Si$, and NiSi are −35.6, −31.5, and −20.5 kcal/mol, respectively, the generation energies of $Pt_2Si$ and PtSi are −20.7 and −15.8 kcal/mol, respectively. That is, since Ni silicide in which the composition ratio of Ni to Si is high has a generation energy lower than that of Pt silicide, it is possible to form more thermodynamically stably silicide. In this way, two kinds of metal materials exist in the gate electrode. One of the two kinds of metal materials reacts with silicon, and the other metal material stably exists as metal or metal-rich silicide. The inventors' findings can be understood from the values disclosed in the document.

In the following embodiments, details for implementing the above-mentioned effects will be described with reference to the accompanying drawings.

First Embodiment

The structure shown in FIG. 1 is a so-called capacitor structure. A first embodiment will be described with reference to the cross-sectional view of a MOSFET structure shown in FIG. 3. In the MOSFET structure shown in FIG. 3, a gate electrode (Pt-containing $Ni_3Si$ electrode 19) and a gate insulating film 4 have the same structure as those shown in FIG. 1.

A semiconductor device 1 according to the first embodiment includes a substrate (silicon substrate 2), the gate insulating film 4 formed on the silicon substrate 2, and a gate electrode (Pt-containing $Ni_3Si$ electrode 19) formed on the gate insulating film 4. The Pt-containing $Ni_3Si$ electrode 19 has a first metal silicide including a first metal material, and a second metal silicide including a second metal material, or the second metal material in a contact portion between the gate insulating film 4 and the Pt-containing $Ni_3Si$ electrode 19. The second metal silicide including the second metal material is metal-rich silicide in which the composition rate of the second metal material to silicon in the second metal silicide including the second metal is greater than 1. The semiconductor device 1 further includes a source/drain region (source/drain diffusion layer 9) and an extension region (extension diffusion layer region 7) which are provided at both sides of the Pt-containing $Ni_3Si$ electrode 19 on the silicon substrate 2, and a silicide layer 11 that is provided on the source/drain region and the extension region. In addition, a gate side wall 8 is provided on the sides of the Pt-containing $Ni_3Si$ electrode 19 and the gate insulating film 4, and an insulating interlayer 12 surrounds the gate side wall 8.

In the metal-rich silicide, it is preferable that the composition ratio of the second metal material to silicon be equal to or greater than 3.

A method of manufacturing the semiconductor device 1 according to the first embodiment includes a first step of forming a polysilicon layer (polysilicon film 5) on the silicon substrate 2 with the gate insulating film 4 interposed therebetween, a second step of patterning the polysilicon film 5, and a third step of forming a metal layer including a first metal film 13 and a second metal film 14 on the polysilicon film 5 and performing a heat treatment on the metal layer at a predetermined temperature to form a gate electrode (Pt-containing $Ni_3Si$ electrode 19) including the first metal silicide including the first metal material and the second metal silicide including the second metal material, or the second metal material in a contact portion between the gate insulating film 4 and the polysilicon film 5. The second metal silicide including the second metal material is metal-rich silicide in which the composition ratio of the second metal material to silicon in the second metal silicide including the second metal material is greater than 1.

In the third step of the manufacturing method, the second metal film 14 and the first metal film 13 may be formed in this order in the metal layer.

In the third step of the manufacturing method, the first metal film 13 and the second metal film 14 may be formed in this order in the metal layer.

In the third step of the manufacturing method, the metal layer may be an alloy film 16 made of a first metal material and a second metal material. In the metal layer, the alloy film 16 and the first metal material may be formed in this order.

FIGS. 4A to 5D are cross-sectional views illustrating a process of manufacturing the MOSFET structure according to the first embodiment. In this embodiment, after an insulating interlayer is formed, the insulating interlayer is polished and planarized. At the same time, a CMP (chemical mechanical polishing) technique capable of exposing an upper part of the gate electrode is performed to manufacture a MOSFET.

Figure 4A:
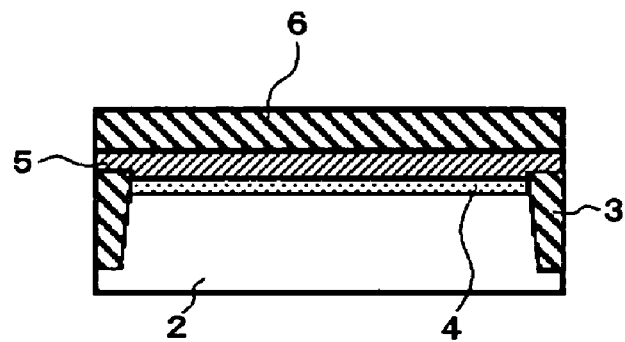
FIGS. 4A to 4E are cross-sectional views illustrating a portion of a process of manufacturing the semiconductor device according to the first embodiment of the invention.

First, as shown in FIG. 4A, an element isolation region 3 is formed in a surface region of the silicon substrate 2 by an STI (shallow trench isolation) technique. Then, the gate insulating film 4 is formed on the silicon substrate 2 in which elements are isolated. The gate insulating film 4 is made of a metal oxide, a metal silicate film, and a high-dielectric-constant insulating film obtained by introducing nitrogen into the metal oxide or the metal silicate. Preferably, the metal in the gate insulating film is Hf or Zr. When the high-dielectric-constant insulating film includes Hf or Zr, the gate insulating film 4 is stable for a high-temperature heat treatment, and it is possible to obtain a film having a small amount of fixed charge.

It is preferable that that a layer including Hf or Zr be formed on one surface of the high-dielectric-constant insulating film that comes into contact with the gate electrode. The threshold voltage of the MOSFET is determined by a combination of the gate electrode 19 and the high-dielectric-constant insulating film that comes into contact with the gate electrode 19. In this case, the level of a contact portion between the silicon substrate 2 and the gate insulating film is reduced, and the influence of the fixed charge in the high-dielectric-constant insulating film is reduced. Therefore, a silicon oxide film or a silicon oxynitride film may be provided in the contact portion between the high-dielectric-constant insulating film and the silicon substrate. It is more preferable that a HfSiON film, or a HfSiON film on a silicon oxide film or a silicon oxynitride film be provided in the contact portion.

In this embodiment, the gate insulating film is made of HfSiON. In this case, the concentration of Hf in the gate insulating film is changed in the depth direction such that the Hf concentration is the highest in the vicinity of the contact portion between the gate electrode 19 and the gate insulating film 4, and a thermal silicon oxide film is formed in the vicinity of the contact portion between the silicon substrate 2 and the gate insulating film 4. In order to obtain the HfSiON film, first, a thermal silicon oxide film having a thickness of 1.9 nm is formed, and Hf is deposited with a thickness of 0.5 nm on the thermal silicon oxide film by a long-throw sputtering method. Then, a first heat treatment is performed in an oxygen atmosphere at a temperature of 500° C. for one minute and a second heat treatment is performed in a nitrogen atmosphere at a temperature of 800° C. for 30 seconds to perform the solid-phase diffusion of Hf into the lower silicon oxide film, thereby forming the HfSiON film. Then, nitridation annealing is performed in a $NH_3$ atmosphere at a temperature of 900° C. for 10 minutes to form the HfSiON film. In addition, a cap insulating film may be formed on or below the high-dielectric-constant insulating film. The cap insulating film is made of, for example, a metal oxide including a metal material selected from Al, La, Mg or the like.

Figure 4B:
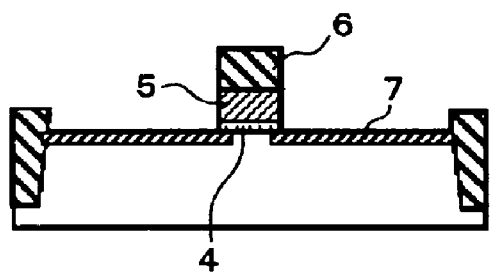

Then, a laminated film of a polysilicon film 5 with a thickness of 60 nm and a silicon oxide film 6 with a thickness of 150 nm is formed on the gate insulating film 4. As shown in FIG. 4B, the laminated film is processed into a gate electrode by a lithography technique and an RIE (reactive ion etching) technique, and then ion implantation is performed to form the extension diffusion layer region 7 in a self-aligned manner, using the gate electrode as a mask.

Figure 4C:
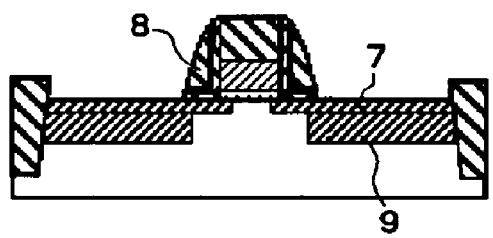

As shown in FIG. 4C, a silicon nitride film and a silicon oxide film are sequentially deposited, and the films are etched-back to form the gate side wall 8. In this state, ion implantation is performed again, and active annealing is performed to form the source/drain diffusion layer 9.

Figure 4D:
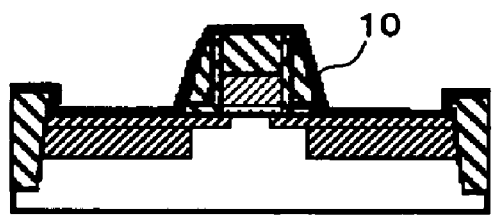
Figure 4E:
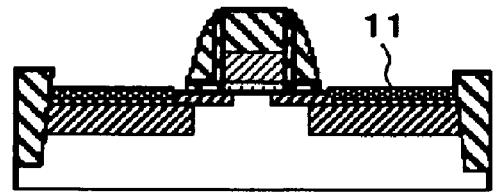

Then, as shown in FIG. 4D, a metal film 10 with a thickness of 20 nm is formed on the entire surface by a sputtering method, and the silicide layer 11 is formed with a thickness of about 40 nm only on the source/drain diffusion layer 9 by a salicide technique using the gate electrode, the gate side wall film, and STI as a mask (FIG. 4E). The silicide layer 11 is made of Ni monosilicide (NiSi) capable of minimizing contact resistance. Instead of Ni silicide, Co silicide or Ti silicide may be used.

Figure 5A:
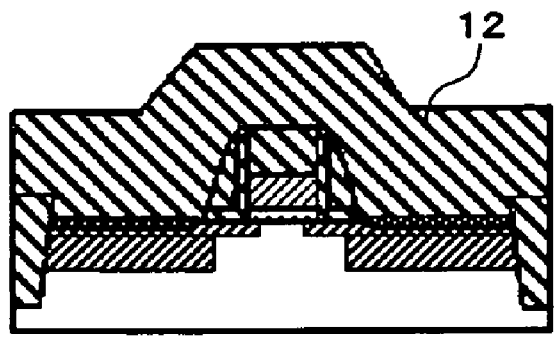
FIGS. 5A to 5D are cross-sectional views illustrating a portion of the process of manufacturing the semiconductor device according to the first embodiment of the invention.
Figure 5B:
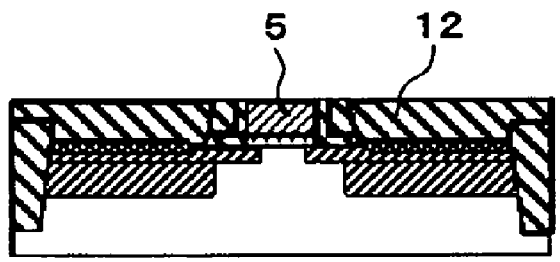

As shown in FIG. 5A, a CVD (chemical vapor deposition) method is used to form the insulating interlayer 12, which is a silicon oxide film. The insulating interlayer 12 is planarized by a CMP technique, as shown in FIG. 5B, and the insulating interlayer 12 is etched to expose the polysilicon film 5.

Figure 5C:
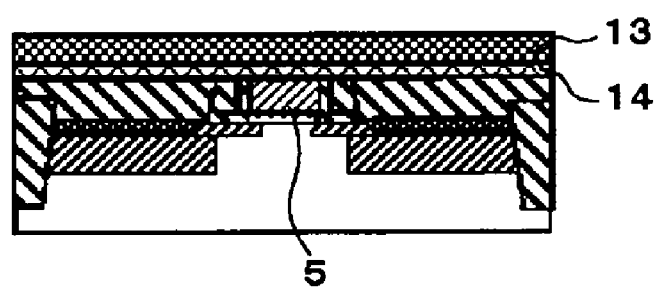

Then, as shown in FIG. 5C, in order to form silicide with the polysilicon film 5 having a gate electrode shape, the second metal film 14 and the first metal film 13 are deposited in this order. For example, a representative deposition method is a sputtering method or a chemical vapor deposition method. In this case, the first metal film 13 is made of a metal material capable of forming silicide with the polysilicon film 5, for example, a metal material selected from Ni, Hf, V, Ti, Ta, W, Co, Cr, Zr, Mo, Nb, and alloys thereof. However, a metal material may be used which is capable of completely siliciding the polysilicon film 5 at a temperature at which the resistance value of the silicide layer 11 formed on the source/drain diffusion layer 9 is not increased any further.

It is preferable that the second metal material has a work function more than the first metal material. In addition, preferably, the silicide of the second metal material is less thermodynamically stable than the silicide of the first metal material, and when a heat treatment is performed to silicide the first metal film 13, the second metal material is likely to exist as metal. That is, it is preferable that the first metal material is more likely to be silicided than the second metal material. In addition, it is preferable that the second metal material be Pt, but the invention is not limited thereto.

In this embodiment, Ni is used as the first metal material, and Pt is used as the second metal material. A combination of Ni and Pt is also used for the silicide layer 11 formed on the source/drain diffusion layer 9, and is relatively easily used to form silicide with the polysilicon film 5. However, other materials may be used without departing the scope of the invention. When a Ni monosilicide (NiSi) layer is formed on the source/drain diffusion layer 9, it is necessary to reduce the temperature of the subsequent process to 500° C. or less in order to prevent an increase in the contact resistance between the source/drain diffusion layer 9 and an interconnect line due to Ni disilicide ($NiSi_2$). In this embodiment, Ni that is sufficiently silicided at a temperature of 500° C. or less is used.

The thickness t2 of the second metal film 14 is an important factor for determining the work function of the silicide gate electrode according to this embodiment, which will be described below. It is preferable that the thickness t2 be equal to or greater than 1 nm and equal to or less than 30 nm. The concentration of the second metal material in the silicide gate is substantially proportional to the thickness t2. If the thickness t2 is equal to or greater than 1 nm and equal to or less than 30 nm, the concentration of the second metal material is equal to or greater than 0.5% and equal to or less than 15%. The concentration of the second metal material in the silicide gate may be uniform. It is more preferable that the concentration of the second metal material have an inclined profile in which the concentration is increased from the surface of the gate electrode to the contact portion between the gate insulating film 4 and the silicide gate electrode or it is the maximum in the contact portion, or the concentration of the second metal material is piled up in a contact portion with the gate insulating film 4. In addition, it is preferable that the concentration of the second metal silicide including a metal-rich second metal material be the same as described above. The concentration of silicon in the first metal silicide including the first metal material may be higher than that of silicon in the second metal silicide including the second metal material.

As known in the related art, the thickness t1 of the first metal film 13 is an important factor for determining the silicide phase of the silicide gate electrode. In addition, the silicide phase of the silicide gate electrode is an important factor for determining the work function of the silicide gate electrode, which will be described below. That is, the work function of the silicide gate electrode is determined by a combination of the thickness t1 of the first metal film 13 and the thickness t2 of the second metal film 14. According to the inventors' examination, it is preferable that the thickness t1 be equal to or greater than the thickness of the polysilicon film 5, and it is more preferable that the thickness t1 be at least 1.2 times more than the thickness of the polysilicon film 5. In this embodiment, a Ni film with a thickness of 90 nm is deposited.

After the second metal film 14 and the first metal film 13 are deposited, the second metal material and the first metal material are diffused into the polysilicon film 5 on the gate insulating film 4 and a heat treatment is performed to generate silicidation reaction. The heat treatment needs to be performed in a non-oxydation atmosphere in order to prevent the oxidation of the metal layer (the second metal film 14 and the first metal film 13). In addition, the heat treatment needs to be performed at a temperature at which a sufficiently high diffusion speed to completely silicide the polysilicon film 5 on the gate insulating film 4 is obtained and the silicide layer 11 formed on the source/drain diffusion layer 9 does not have a large resistance value.

In this embodiment, since both the silicide layer 11 formed on the source/drain diffusion layer 9 and the silicide formed on the silicide gate electrode are made of Ni, the heat treatment is performed in a nitrogen gas atmosphere at a temperature of 450° C. for 5 minutes. When the silicide formed on the source/drain diffusion layer 9 is Co silicide or Ti silicide, the allowable heat treatment temperature is increased to, for example, about 800° C. The heat treatment process is important. For example, when the heat treatment is performed at a temperature of 400° C. for 5 minutes, $Pt_2Si$ is formed. When the heat treatment is performed at a temperature of 420° C., the material exists as Pt. It is preferable that the heat treatment be performed at a temperature of 450° C. The heat treatment causes Ni and Pt to be diffused into the polysilicon film 5, thereby generating silicidation reaction. As a result, the polysilicon film 5 is silicided in the contact portion between the gate insulating film 4 and the Pt-containing $Ni_3Si$ electrode 19. Then, X-ray diffraction (XRD) measurement is performed. As a result of the measurement, the composition ratio of Ni/(Ni+Si) in the silicide is about 0.75 ($Ni_3Si$ phase).

As can be seen from the X-ray photoelectron spectrum shown in FIG. 2B, Pt in the silicide gate electrode is contained in the first metal silicide $Ni_3Si$ including the first metal material, as non-silicided Pt or Pt silicided in a metal-rich silicide state (when it is represented by PtxSi, $x \geq 3$) in which the composition ratio of Pt to silicon is equal to or greater than 3. Finally, the remaining Ni and Pt films that have not been subjected to silicidation reaction during the heat treatment are removed by a wet etching method using a sulfuric acid/hydrogen peroxide aqueous solution or nitrohydrochloric acid.

Figure 6A:
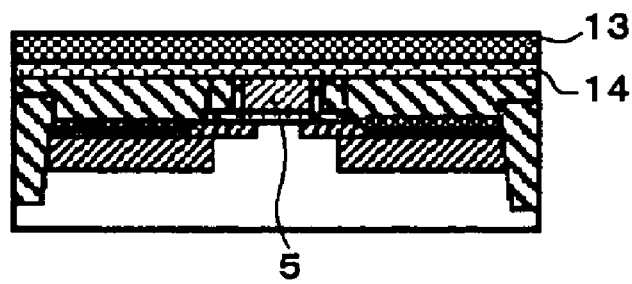
FIGS. 6A to 6D are cross-sectional views illustrating a portion of the process of manufacturing the semiconductor device according to the first embodiment of the invention.
Figure 6B:
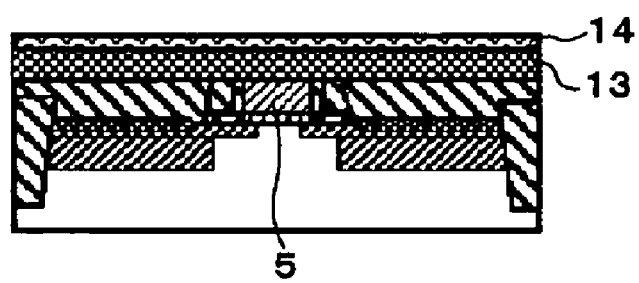

The inventors have conducted a more detailed examination and found that a method of introducing the second metal material and the first metal material into the polysilicon film 5 is not limited to that shown in FIG. 5C, but other methods can be used. FIGS. 6A to 6D show other methods of introducing the second metal material and the first metal material into the polysilicon film 5. FIG. 6A shows the same method as that shown in FIG. 5C. In FIG. 6B, the order of the second metal film 14 and the first metal film 13 shown in FIG. 6A is reversed. In this method, the second metal material is also diffused to a contact portion with the gate insulating film 4.

Figure 6C:
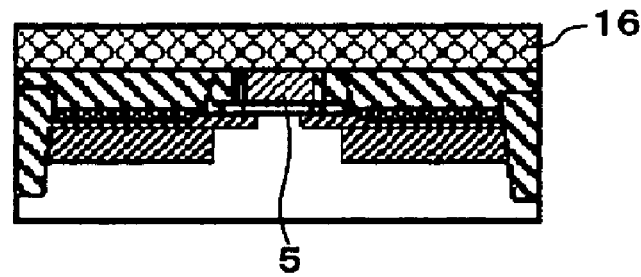
Figure 6D:
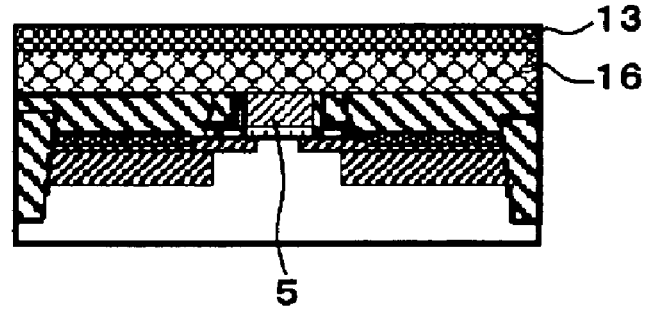

As another method, the alloy film 16 made of a mixture of the first metal material and the second metal material is used. FIG. 6C shows a method of forming the alloy film 16 on the polysilicon film 5, and FIG. 6D shows a method of forming the alloy film 16 and the first metal film 13 on the polysilicon film 5. In both the methods, the second metal material is diffused to a contact portion with the gate insulating film 4, and desired characteristics are obtained. However, a more important factor is a heat treatment temperature for silicidation. The heat treatment may be performed at a temperature of about 400° C. to reduce the heat treatment temperature a little.

However, it is more preferable that the heat treatment be performed at a temperature of 420° C. or more.

Figure 5D:
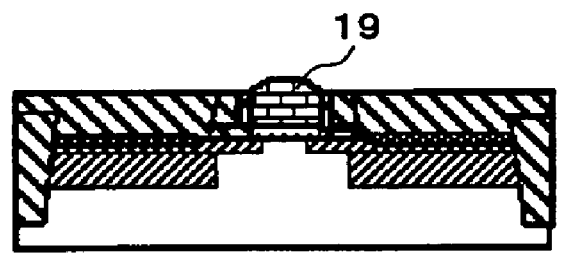

In the above-mentioned processes, the peeling of the silicide electrode is not observed. A MOSFET structure including the Pt-containing $Ni_3Si$ electrode 19 shown in FIG. 5D is formed by the above-mentioned processes.

The semiconductor device 1 according to this embodiment includes two transistors (not shown) including the gate electrodes (Pt-containing $Ni_3Si$ electrodes 19). The two transistors have different composition ratios of the first metal silicide including the first metal material, the second metal silicide including the second metal material, and the second metal material in the Pt-containing $Ni_3Si$ electrode 19.

In this way, it is possible to control the work functions of two Pt-containing $Ni_3Si$ electrodes 19 to be different from each other in the same process by adjusting the thicknesses of the second metal film 14 and the first metal film 13 to change the composition ratio, without substantially changing the thickness of the polysilicon film 5. It is preferable that the semiconductor device 1 be a P-channel transistor or an N-channel transistor.

Figure 7:
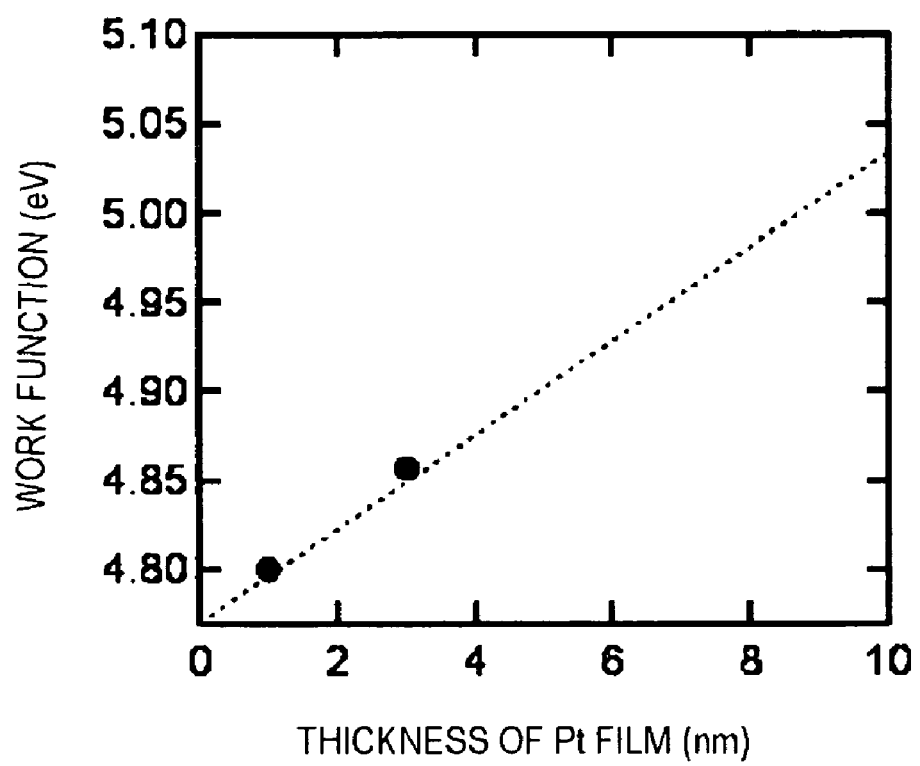
FIG. 7 is a diagram illustrating the relationship between the work function and the content of Pt in a Pt-added Ni silicide electrode according to the first embodiment of the invention.
Figure 8A:
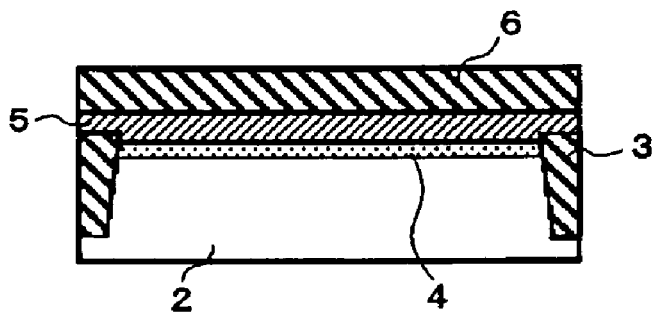
FIGS. 8A to 8E are cross-sectional views illustrating a portion of a process of manufacturing a semiconductor device according to a second embodiment of the invention.
Figure 8B:
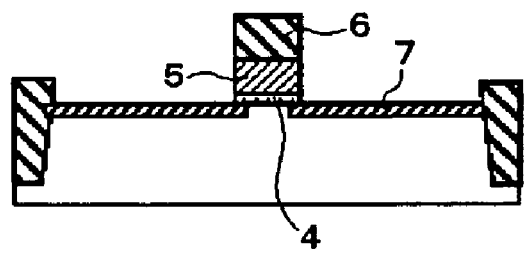
Figure 8C:
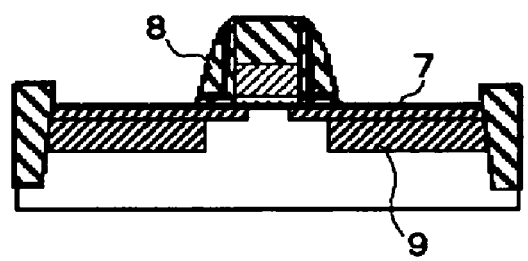
Figure 8D:
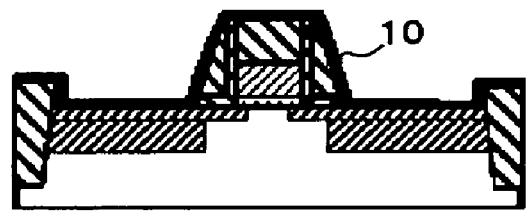
Figure 8E:
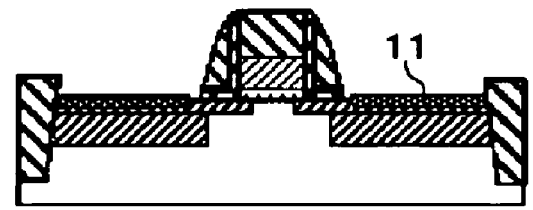

In the MOSFET structure including the Pt-containing $Ni_3Si$ electrode 19 formed by the above-mentioned processes, characteristics suitable for a P-type MOSFET are obtained. FIG. 7 shows the work function obtained from the C-V characteristics of a CMOS transistor including the HfSiON film made of a high-dielectric-constant material as the gate insulating film 4 by controlling the thickness of the Pt film using this embodiment.

As can be seen from FIG. 7, when the thickness of the Pt film is increased, the work function is increased. The gate voltage dependence of a drain current of the P-type MOSFET including the Pt-containing $Ni_3Si$ electrode 19 is good, and a threshold voltage is lower than that of $Ni_3Si$ that does not include Pt by 0.1 V or more. In addition, hole mobility is measured, and the measured results prove that the same value as that in a transistor made of a combination of poly-Si and $SiO_2$ is obtained. In this way, it is possible to obtain good P-type MOSFET characteristics by combining the Pt-containing $Ni_3Si$ electrode 19 according to this embodiment with the HfSiON gate insulating film (gate insulating film 4).

In addition, as the gate electrode of the N-type MOSFET required for a complementary MOSFET, for example, $NiSi_2$ (a work function of 4.4 eV) or NiSi (a work function of 4.5 eV) is effective in order to make main metal (Ni) of Pt-containing $Ni_3Si$ for the P-type MOSFET according to this embodiment correspond to main metal (Ni) of silicides. It is possible to form an N-type MOSFET having a low threshold voltage by combining $NiSi_2$, NiSi, and the implantation of nitrogen ions into the channel (about 1E15 cm-2). In this way, it is possible to obtain a complementary MOSFET having a high performance, high reliability, and a relatively small manufacturing cost.

Second Embodiment

Figure 3:
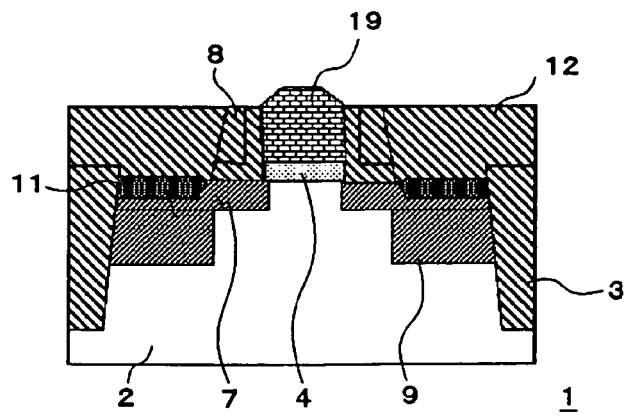
FIG. 3 is a cross-sectional view illustrating the structure of a semiconductor device according to a first embodiment of the invention.

The final structure of a second embodiment is the same as the MOSFET structure according to the first embodiment of the invention shown in FIG. 3. However, the second embodiment is different from the first embodiment in a manufacturing process, and is characterized in that a device is easily manufactured.

In a method of manufacturing a semiconductor device 1 according to the second embodiment, in the third step, the first metal film 13, the second metal film 14, and another first metal film (a first metal film 15) may be formed in this order in the metal layer.

FIGS. 8A to 8E and FIGS. 9A to 9D are cross-sectional views illustrating a process of manufacturing the MOSFET structure according to the second embodiment. In this embodiment, after an insulating interlayer is formed, the insulating interlayer is polished and planarized. At the same time, a CMP (chemical mechanical polishing) technique capable of exposing an upper part of the gate electrode is performed to manufacture a MOSFET.

Figure 9A:
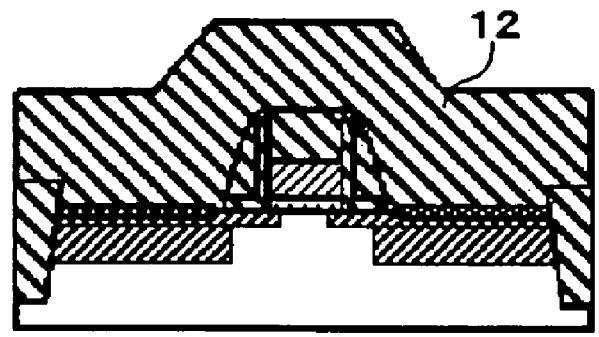
FIGS. 9A to 9D are cross-sectional views illustrating a portion of the process of manufacturing the semiconductor device according to the second embodiment of the invention.
Figure 9B:
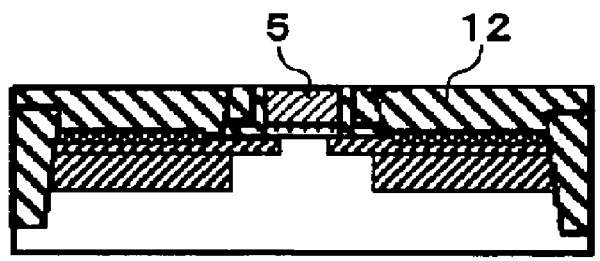

The processes shown in FIGS. 8A to 8E and FIGS. 9A and 9B are the same as those shown in FIGS. 4A to 4E and FIGS. 5A and 5B according to the first embodiment. As shown in FIG. 9B, the insulating interlayer 12 of the silicon oxide film formed by a CVD (chemical vapor deposition) method is planarized by a CMP technique, and the insulating interlayer 12 is etched to expose the polysilicon film 5.

Figure 9C:
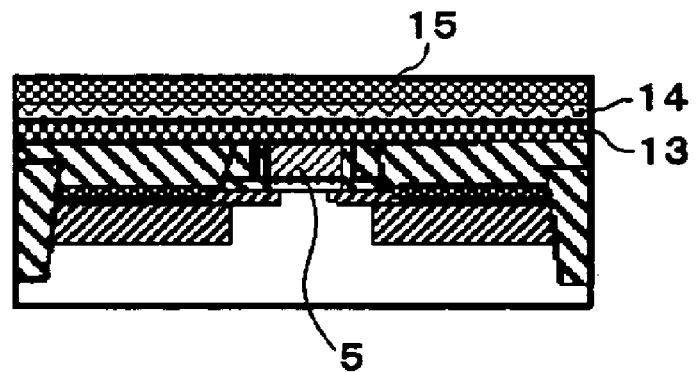

Then, as shown in FIG. 9C, in order to form silicide with the polysilicon film 5 having a gate electrode shape, the first metal film 13, the second metal film 14, and the first metal film 15 are deposited in this order. For example, a representative deposition method is a sputtering method or a chemical vapor deposition method. In this case, the first metal films 13 and another first metal film 15 are made of a metal material capable of forming silicide with the polysilicon film 5, for example, a metal material selected from Ni, Hf, V, Ti, Ta, W, Co, Cr, Zr, Mo, Nb, and alloys thereof. However, a metal material may be used which is capable of completely siliciding the polysilicon film 5 at a temperature at which the resistance value of the silicide layer 11 formed on the source/drain diffusion layer 9 is not increased any further.

It is preferable that a metal material having a high work function be used as the second metal material. In addition, preferably, the silicide of the second metal material is less thermodynamically stable than the silicide of the first metal material and another first metal material. When a heat treatment is performed to silicide the first metal films 13 and 15, the second metal material is likely to exist as metal.

In this embodiment, Ni is used as the first metal material and another first metal material, and Pt is used as the second metal material. A combination of Ni and Pt is also used for the silicide layer 11 formed on the source/drain diffusion layer 9, and is relatively easily used to form silicide with the polysilicon film 5. However, other materials may be used without departing the scope of the invention.

When a Ni monosilicide (NiSi) layer is formed on the source/drain diffusion layer 9, it is necessary to reduce the temperature of the subsequent process to 500° C. or less in order to prevent an increase in the contact resistance between the source/drain diffusion layer 9 and an interconnect line due to Ni disilicide ($NiSi_2$). In this embodiment, Ni that is sufficiently silicided at a temperature of 500° C. or less is used.

The thickness t2 of the second metal film 14 is an important factor for determining the work function of the silicide gate electrode according to this embodiment, which will be described below. It is preferable that the thickness t2 be equal to or greater than 1 nm and equal to or less than 30 nm. The concentration of the second metal material in the silicide gate is substantially proportional to the thickness t2. If the thickness t2 is equal to or greater than 1 nm and equal to or less than 30 nm, the concentration of the second metal material is equal to or greater than 0.5% and equal to or less than 15%. It is more preferable that the concentration of the second metal material have an inclined profile in which the concentration is increased from the surface of the gate electrode to the contact portion between the gate insulating film 4 and the silicide gate electrode or it is the maximum in the contact portion, or the concentration of the second metal material is piled up in the contact portion with the gate insulating film 4. In addition, it is preferable that the concentration of the second metal silicide including a metal-rich second metal material be the same as described above.

The sum t1+t3 of the thickness t1 of the first metal film 13 and the thickness t3 of the first metal film 15 is an important factor for determining the silicide phase of the silicide gate electrode. The silicide phase of the silicide gate electrode is an important factor for determining the work function of the silicide gate electrode, which will be described below. That is, the work function of the silicide gate electrode is determined by a combination of the sum t1+t3 and the thickness t2 of the second metal film 14.

According to the inventors' examination, it is preferable that the sum t1+t3 be equal to or greater than the thickness of the polysilicon film 5, and it is more preferable that the sum t1+t3 be at least 1.2 times more than the thickness of the polysilicon film 5. In this embodiment, a Ni film in which t1 is 5 nm and t3 is 95 nm, that is, t1+t3 is 100 nm is deposited. In the experiment in which t1+t3 is 100 nm, the thickness t2 of Pt is 5 nm, and the thickness t1 is changed in the range of 3 nm to 40 nm, the content of Pt in $Ni_3Si$ is constant in the range of $t1 \leqq 30$ nm. When t1 is 40 nm, the content of Pt is reduced. When t1 is increased, the thickness t3 of the Ni film on the Pt film is increased. Therefore, it is necessary to sufficiently implant Pt. However, when the sum t1+t3 is excessively increased, an extra deposition thickness is also increased, which is not preferable. Therefore, it is considered that $t1 \leqq 30$ nm is preferable.

After the first metal film 13, the second metal film 14, and the first metal film 15 are deposited, the first metal material, the second metal material, and another first metal material are diffused into the polysilicon film 5 on the gate insulating film 4 and a heat treatment is performed to generate silicidation reaction. The heat treatment needs to be performed in a non-oxydation atmosphere in order to prevent the oxidation of the metal layer (the first metal film 13, the second metal film 14, and the first metal film 15). In addition, the heat treatment needs to be performed at a temperature at which a sufficiently high diffusion speed to completely silicide the polysilicon film 5 on the gate insulating film 4 is obtained and the silicide layer 11 formed on the source/drain diffusion layer 9 does not have a large resistance value.

In this embodiment, since both the silicide layer 11 formed on the source/drain diffusion layer 9 and the silicide formed on the gate electrode are made of Ni, the heat treatment is performed in a nitrogen gas atmosphere at a temperature of 450° C. for 5 minutes. When the silicide formed on the source/drain diffusion layer 9 is Co silicide or Ti silicide, the allowable heat treatment temperature is increased to, for example, about 800° C. The heat treatment process is important. For example, when the heat treatment is performed at a temperature of 400° C. for 5 minutes, $Pt_2Si$ is formed. When the heat treatment is performed at a temperature of 420° C., the material exists as Pt. It is preferable that the heat treatment be performed at a temperature of 450° C. The heat treatment causes Ni and Pt to be diffused into the polysilicon film 5, thereby generating silicidation reaction. As a result, the polysilicon film 5 is silicided in the contact portion between the gate insulating film 4 and the Pt-containing $Ni_3Si$ electrode 19.

Then, X-ray diffraction (XRD) measurement is performed. As a result of the measurement, the composition ratio of Ni/(Ni+Si) in the silicide is about 0.75 ($Ni_3Si$ phase). As can be seen from the X-ray photoelectron spectrum shown in FIG. 2B, Pt in the silicide gate electrode is contained in the first metal silicide $Ni_3Si$ including the first metal material, as non-silicided Pt or Pt silicided in a metal rich silicide state (when it is represented by PtxSi, $x \geqq 3$) in which the composition ratio of Pt to silicon is equal to or greater than 3.

Finally, the remaining Ni and Pt films that have not been subjected to silicidation reaction during the heat treatment are removed by a wet etching method using a sulfuric acid/hydrogen peroxide aqueous solution or nitrohydrochloric acid. In this case, the first metal film 13 directly deposited on the polysilicon film 5 and the insulating interlayer 12 prevents the second metal film 14 from being driven into the insulating interlayer 12 and facilitates the removal of the remaining Pt film during wet etching.

Figure 9D:
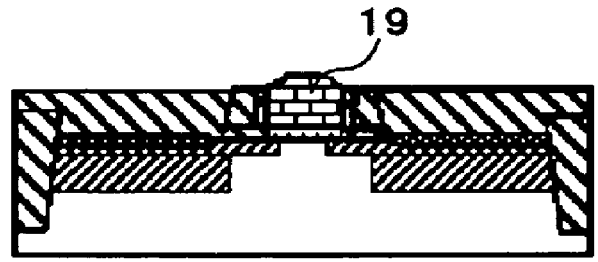
Figure 10A:
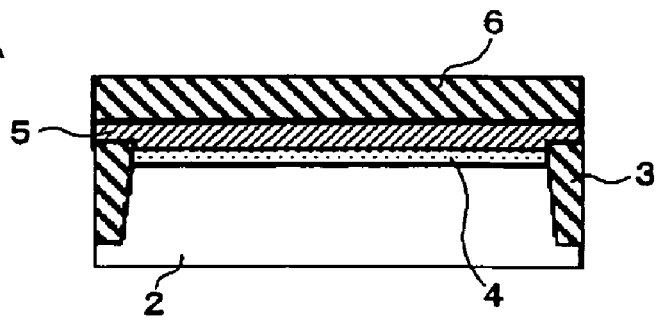
FIGS. 10A to 10E are cross-sectional views illustrating a portion of a process of manufacturing a semiconductor device according to a third embodiment of the invention.
Figure 10B:
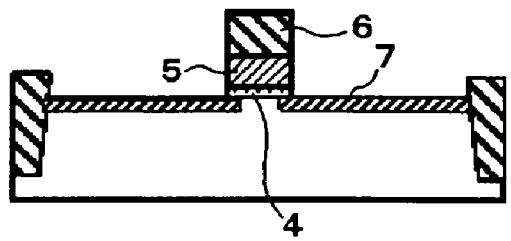
Figure 10C:
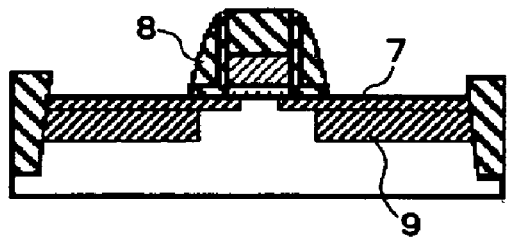
Figure 10D:
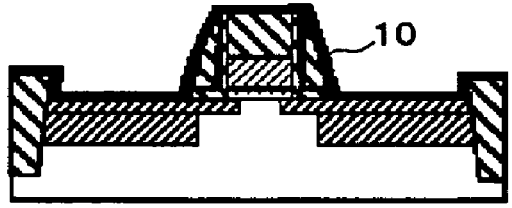
Figure 10E:
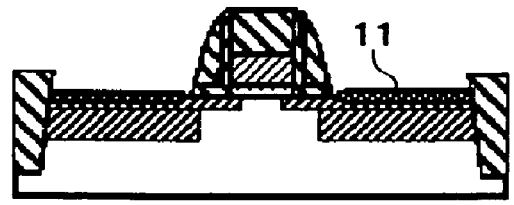

In the above-mentioned processes, the peeling of the silicide electrode is not observed. A MOSFET structure including the Pt-containing $Ni_3Si$ electrode 19 shown in FIG. 9D is formed by the above-mentioned processes.

In the MOSFET structure including the Pt-containing $Ni_3Si$ electrode 19 formed by the above-mentioned processes, characteristics suitable for a P-type MOSFET are obtained. In addition, since Ni is deposited below Pt, it is possible to preferentially diffuse Ni into the polysilicon film 5 and thus preferentially couple Ni with polysilicon in the contact portion between the gate insulating film 4 and the Pt-containing $Ni_3Si$ electrode 19.

Therefore, it is possible to make the conditions that Pt is more likely to be silicided and increase the work function by 50 meV. In this way, it is possible to obtain good P-type MOSFET characteristics by combining the Pt-containing $Ni_3Si$ electrode 19 according to this embodiment with a HfSiON gate insulating film (gate insulating film 4). In addition, it is easy to perform wet etching. As a result, it is possible to reduce process costs.

In addition, as the gate electrode of the N-type MOSFET required for a complementary MOSFET, for example, $NiSi_2$ (a work function of 4.4 eV) or NiSi (a work function of 4.5 eV) is effective in order to make main metal (Ni) of Pt-containing $Ni_3Si$ for the P-type MOSFET according to this embodiment correspond to main metal (Ni) of silicides. It is possible to form an N-type MOSFET meeting a low threshold voltage requirement by combining $NiSi_2$, NiSi, and the implantation of nitrogen ions into the channel (about 1E15 cm-2). In this way, it is possible to obtain a complementary MOSFET having a high performance, high reliability, and a relatively small manufacturing cost.

Third Embodiment

The final structure of a third embodiment is shown in FIG. 12C. This structure is characterized in that a Pt-containing NiSi gate electrode 18 is formed in an N-type MOSFET region and a Pt-containing $Ni_3Si$ gate electrode 19 is formed in a P-type MOSFET region.

A semiconductor device according to the third embodiment includes a P-channel transistor and an N-channel transistor. The composition ratio of a first metal material to silicon in a first metal silicide including the first metal material in the N-channel transistor is lower than the composition ratio of a first metal material to silicon in a first metal silicide including the first metal material in the P-channel transistor.

The N-channel transistor may be a cell transistor of a dynamic random access memory.

A method of manufacturing the semiconductor device according to the third embodiment further includes, after the third step, a step of removing the first metal film 13 and the second metal film 14 and a step of patterning a hard mask 17 to expose a desired region on a gate electrode (Pt-containing NiSi electrode 18), forming a metal layer including a another first metal film (the first metal film 15) on the Pt-containing NiSi electrode 18, and performing a heat treatment on the metal layer at a predetermined temperature to form a gate electrode (Pt-containing $Ni_3Si$ electrode 19) including the first metal silicide containing the first metal material in a contact portion between the gate insulating film 4 and the Pt-containing $Ni_3Si$ electrode 19.

It is preferable that the second metal silicide including the second metal material be a metal-rich silicide in which the composition ratio of the second metal material to silicon in the second metal silicide including the second metal material is greater than 1.

FIGS. 10A to 10E, FIGS. 11A to 11D, and FIGS. 12A to 12C are cross-sectional views illustrating a process of manufacturing the MOSFET structure according to the third embodiment. In this embodiment, after an insulating interlayer is formed, the insulating interlayer is polished and planarized. At the same time, a CMP (chemical mechanical polishing) technique capable of exposing an upper part of the gate electrode is performed to manufacture a MOSFET.

Figure 11A:
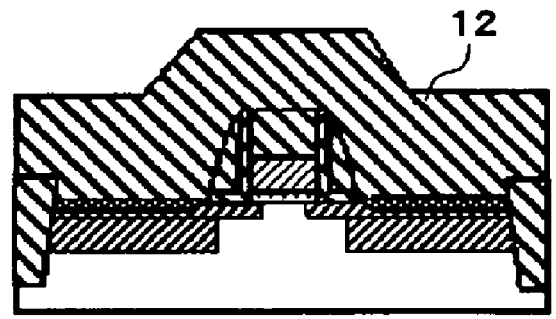
FIGS. 11A to 11D are cross-sectional views illustrating a portion of the process of manufacturing the semiconductor device according to the third embodiment of the invention.
Figure 11B:
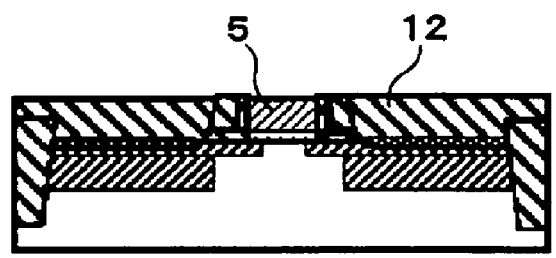

The processes shown in FIGS. 10A to 10E and FIGS. 11A to 11D are similarly performed on the N-type MOSFET and the P-type MOSFET. The processes shown in FIGS. 10A to 10E and FIGS. 11A and 11B are the same as those shown in FIGS. 4A to 4E and FIGS. 5A and 5B according to the first embodiment. As shown in FIG. 11B, the insulating interlayer 12 of the silicon oxide film formed by a CVD (chemical vapor deposition) method is planarized by a CMP technique, and the insulating interlayer 12 is etched to expose the polysilicon film 5 of the gate electrode.

Figure 11C:
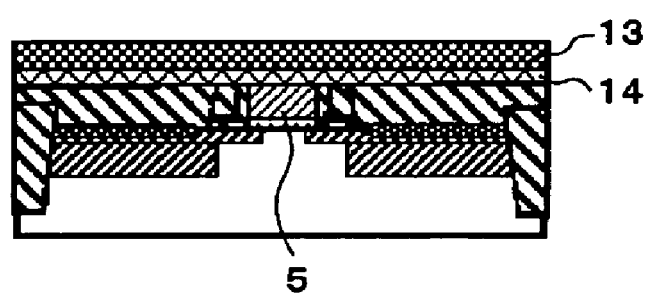

Then, as shown in FIG. 11C, in order to form silicide with the polysilicon film 5 having a gate electrode shape, the second metal film 14 and the first metal film 13 are deposited in this order. For example, a representative deposition method is a sputtering method or a chemical vapor deposition method. In this case, the first metal material may be selected from metal materials capable of forming silicide with the polysilicon film 5, such as Ni, Hf, V, Ti, Ta, W, Co, Cr, Zr, Mo, Nb, and alloys thereof. However, a metal material may be used which is capable of completely siliciding the polysilicon film 5 at a temperature at which the resistance value of the silicide layer 11 formed on the source/drain diffusion layer 9 is not increased any further.

It is preferable that the second metal layer 14 be made of a metal material having a high work function. In addition, preferably, the silicide of the second metal material is less thermodynamically stable than the silicide of the first metal material. When a heat treatment is performed to silicide the first metal film 13, the second metal material is likely to exist as metal.

In this embodiment, Ni is used as the first metal material and Pt is used as the second metal material. A combination of Ni and Pt is also used for the silicide layer 11 formed on the source/drain diffusion layer 9, and is relatively easily used to form silicide with the polysilicon film 5. However, other materials may be used without departing the scope of the invention. When a Ni monosilicide (NiSi) layer is formed on the source/drain diffusion layer 9, it is necessary to reduce the temperature of the subsequent process to 500° C. or less in order to prevent an increase in the contact resistance between the source/drain diffusion layer 9 and an interconnect line due to Ni disilicide ($NiSi_2$). In this embodiment, Ni that is sufficiently silicided at a temperature of 500° C. or less is used.

The thickness t2 of the second metal film 14 is an important factor that determines the work function of the silicide gate electrode according to this embodiment, which will be described below. It is preferable that the thickness t2 be equal to or greater than 1 nm and equal to or less than 30 nm. The concentration of the second metal material in the silicide gate is substantially proportional to the thickness t2. If the thickness t2 is equal to or greater than 1 nm and equal to or less than 30 nm, the concentration of the second metal material is equal to or greater than 0.5% and equal to or less than 15%. The concentration of the second metal material in the silicide gate may be uniform. It is more preferable that the concentration of the second metal material have an inclined profile in which the concentration is increased from the surface of the gate electrode to the contact portion between the gate insulating film 4 and the silicide gate electrode or it is the maximum in the contact portion, or the concentration of the second metal material is piled up in a contact portion with the gate insulating film 4. In addition, it is preferable that the concentration of the second metal silicide including a metal-rich second metal material be the same as described above.

As known in the related art, the thickness t1 of the first metal film 13 is an important factor for determining the silicide phase of the silicide gate electrode. In addition, the silicide phase of the silicide gate electrode is an important factor for determining the work function of the silicide gate electrode, which will be described below. That is, the work function of the silicide gate electrode is determined by a combination of the thickness t1 of the first metal film 13 and the thickness t2 of the second metal film 14. According to the inventors' examination, it is preferable that the thickness t1 be three-fourths or less of the thickness of the polysilicon film 5. In this embodiment, a Ni film with a thickness of 42 nm is deposited.

After the second metal film 14 and the first metal film 13 are deposited, the second metal material and the first metal material are diffused into the polysilicon film 5 on the gate insulating film 4, and a heat treatment is performed to generate silicidation reaction. The heat treatment needs to be performed in a non-oxydation atmosphere in order to prevent the oxidation of the metal layer (the second metal film 14 and the first metal film 13). In addition, the heat treatment needs to be performed at a temperature at which a sufficiently high diffusion speed to completely silicide the polysilicon film 5 on the gate insulating film 4 is obtained and the silicide layer 11 formed on the source/drain diffusion layer 9 does not have a large resistance value.

In this embodiment, since both the silicide layer 11 formed on the source/drain diffusion layer 9 and the silicide formed on the gate electrode are made of Ni, the heat treatment is performed in a nitrogen gas atmosphere at a temperature of 450° C. for 5 minutes. When the silicide formed on the source/drain diffusion layer 9 is Co silicide or Ti silicide, the allowable heat treatment temperature is increased to, for example, about 800° C. The heat treatment causes Ni and Pt to be diffused into the polysilicon film 5, thereby generating silicidation reaction. As a result, the polysilicon film 5 is silicided in the contact portion between the gate insulating film 4 and the Pt-containing NiSi electrode 18. Then, X-ray diffraction (XRD) measurement is performed. As a result of the measurement, the composition ratio of Ni/(Ni+Si) in the silicide is about 0.5 (NiSi phase). Finally, the remaining Ni and Pt films that have not been subjected to silicidation reaction during the heat treatment are removed by a wet etching method using a sulfuric acid/hydrogen peroxide aqueous solution or nitrohydrochloric acid.

The inventors have conducted a more detailed examination and found that a method of introducing the second metal material and the first metal material into the polysilicon film 5 is not limited to that shown in FIG. 11C, but other methods can be used. FIGS. 6A to 6D show other methods of introducing the second metal material and the first metal material into the polysilicon film 5. FIG. 6A shows the same method as that shown in FIG. 11C. In FIG. 6B, the order of the second metal film 14 and the first metal film 13 shown in FIG. 6A is reversed. In this method, the second metal material is also diffused to the contact portion between the gate insulating film 4 and the Pt-containing NiSi electrode 18.

As another method, an alloy film 16 made of a mixture of the first metal material and the second metal material is used. FIG. 6C shows a method of depositing the alloy film 16 on the polysilicon film 5, and FIG. 6D shows a method of depositing the alloy film 16 and the first metal film 13 on the polysilicon film 5. In both the methods, the second metal material is diffused to a contact portion with the gate insulating film 4, and desired characteristics are obtained. However, an important factor is the thickness of the first metal film 13 to be deposited. It is preferable that the thickness of the first metal film 13 be three-fourths or less of the thickness of the polysilicon film 5.

Figure 11D:
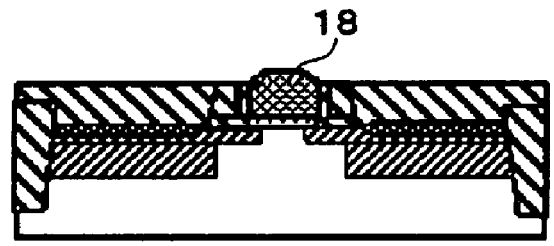

In the above-mentioned processes, the peeling of the silicide electrode is not observed. A MOSFET structure including the Pt-containing NiSi electrode 18 shown in FIG. 11D is formed by the above-mentioned processes.

Figure 13:
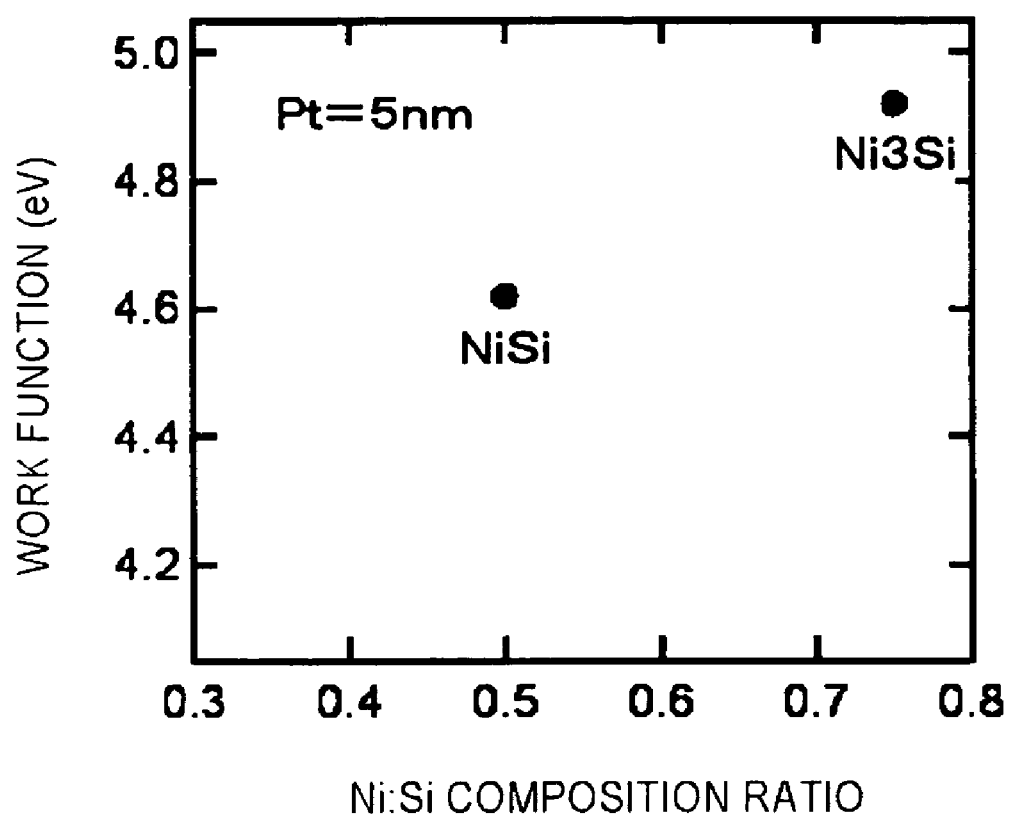
FIG. 13 is a diagram illustrating the relationship between the work function and the content of Pt in a Pt-added Ni silicide electrode according to the third embodiment of the invention when the content of Ni in a Ni silicide electrode is changed.
Figure 14A:
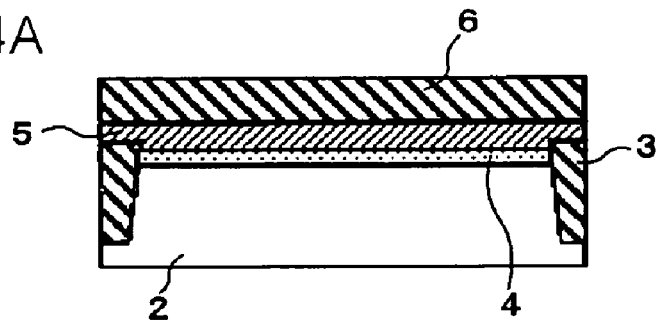
FIGS. 14A to 14E are cross-sectional views illustrating a portion of a process of manufacturing a semiconductor device according to a fourth embodiment of the invention.
Figure 14B:
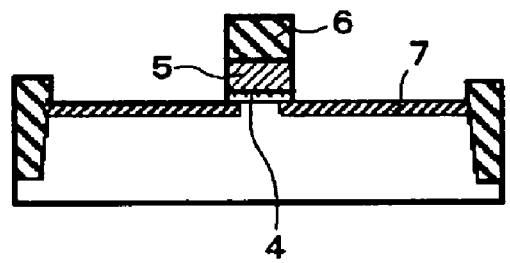
Figure 14C:
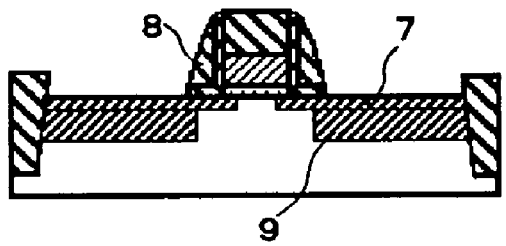
Figure 14D:
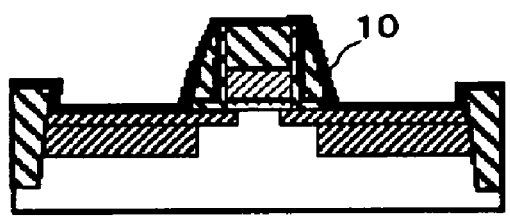
Figure 14E:
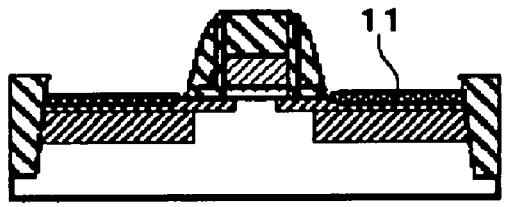

As can be seen from FIG. 13, when the composition of the first metal silicide including the first metal material in the gate electrode is changed from NiSi to $Ni_3Si$, the work function is increased. When the $Ni_3Si$ gate electrode 19 is used as the gate electrode, a semiconductor device 1 having a low threshold voltage is achieved. Therefore, a process of increasing the content of Ni of the Pt-containing NiSi electrode 18 in the P-type MOSFET region to change the Pt-containing NiSi electrode 18 into the Pt-containing $Ni_3Si$ electrode 19 is performed.

First, the hard mask 17 is deposited on the entire surface of the substrate. For example, a CVD method is suitable as the deposition method. It is preferable that the hard mask be made of a film that can be completely removed in the subsequent process, such as a silicon oxide film, a silicon nitride film, or other insulating films. It is preferable that the thickness of the hard mask be equal or greater than about 30 nm and equal to or less than about 100 nm.

Then, a lithography technique and an RIE (reactive ion etching) technique are used to pattern the hard mask 17 and etch only the P-type MOSFET region. Then, a first metal film 15 is deposited (FIG. 12A). For example, a representative deposition method is a sputtering method or a chemical vapor deposition method. In this case, a Ni film with a thickness of about 30 nm to 60 nm is preferably used as the first metal film 15.

A Ti film with a thickness of equal to or greater than 3 nm and equal to or less than 10 nm may be provided below the Ni film. The Ti film takes away oxygen from a thin silicon oxide film to be formed on Pt-containing NiSi and facilitates the diffusion of Ni into the first metal film 15.

After the first metal film 15 is deposited, the first metal material is diffused into the Pt-containing NiSi electrode 18, and a heat treatment is performed to increase the content of Ni in the silicide. The heat treatment needs to be performed in a non-oxydation atmosphere in order to prevent the oxidation of the first metal film 15. In addition, the heat treatment needs to be performed at a temperature at which a sufficiently high diffusion speed to increase the content of Ni in the Pt-containing NiSi electrode 18 is obtained and the silicide layer 11 formed on the source/drain diffusion layer 9 does not have a large resistance value. In this embodiment, since both the silicide layer 11 formed on the source/drain diffusion layer 9 and the silicide formed on the gate electrode are made of Ni, the heat treatment is performed in a nitrogen gas atmosphere at a temperature of 450° C. for 5 minutes.

However, when the silicide formed on the source/drain diffusion layer 9 is Co silicide or Ti silicide, the allowable heat treatment temperature is increased to, for example, about 800° C. When the thickness of the Ti film is about 5 nm, the heat treatment may be performed at a temperature of 450° C. However, when the thickness of the Ti film is about 10 nm, the heat treatment needs to be performed at a temperature of 500° C. The heat treatment causes the content of Ni in the Pt-containing NiSi electrode 18 to be selectively increased only in the P-type MOSFET, thereby changing the Pt-containing NiSi electrode 18 into the Pt-containing $Ni_3Si$ electrode 19.

Then, X-ray diffraction (XRD) measurement is performed. As a result of the measurement, the composition ratio of Ni/(Ni+Si) in the silicide is about 0.75 ($Ni_3Si$ phase). Finally, the remaining Ni film that has not been subjected to silicidation reaction in the heat treatment is removed by a wet etching method using a sulfuric acid/hydrogen peroxide aqueous solution (FIG. 12B). In addition, for example, selective etching is performed to remove the hard mask 17 to obtain a complementary MOSFET structure in which the Pt-containing NiSi electrode 18 is used as the gate electrode of an N-type MOSFET and the Pt-containing $Ni_3Si$ electrode 19 is used as the gate electrode of a P-type MOSFET, as shown in FIG. 12C.

A method of manufacturing the semiconductor device according to this embodiment includes: a first step of forming a polysilicon layer (polysilicon film 5) on the silicon substrate 2 with the gate insulating film 4 interposed therebetween; a second step of patterning the polysilicon film 5; a step of forming a first metal layer including the first metal film 13 on the polysilicon film 5 and performing a heat treatment on the first metal layer at a predetermined temperature to form a gate electrode (NiSi or $NiSi_2$ electrode 27) including a first metal silicide including a first metal material in a contact portion between the gate insulating film 4 and the polysilicon film 5; a step of removing the first metal film 13; and a step of patterning the hard mask 17 to expose a desired region on the NiSi or $NiSi_2$ electrode 27, forming a second metal layer including the second metal film 14 on the NiSi or $NiSi_2$ electrode 27, and performing a heat treatment on the second metal layer at a predetermined temperature to form a gate electrode (Pt-containing NiSi or $NiSi_2$ electrode (not shown)) including a second metal silicide containing a second metal material, or the second metal material in a contact portion between the gate insulating film 4 and the NiSi or $NiSi_2$ electrode 27.

It is preferable that the second metal silicide including the second metal material be a metal-rich silicide in which the composition ratio of the second metal material to silicon in the second metal silicide including the second metal material is greater than 1.

In the P-type MOSFET structure formed by the above-mentioned processes that includes as the gate electrode the Pt-containing $Ni_3Si$ electrode 19 made of $Ni_3Si$ including Pt (when the thickness of the original Pt film is 5 nm), the work function of the electrode is 4.92 eV, and characteristics suitable for the P-type MOSFET are obtained.

In the N-type MOSFET structure that includes as the gate electrode the Pt-containing NiSi electrode 18 made of NiSi including Pt, the work function of the electrode is 4.62 eV, and characteristics suitable for a transistor for a dynamic random access memory or a static random access memory requiring characteristics around the mid-gap are obtained. A cap film made of a La oxide or a thin Al layer is provided in the contact portion between the Pt-containing NiSi electrode 18 and the gate insulating film 4. In this case, the work function is about in the range of 4.12 to 4.28 eV, and characteristics suitable for the N-type MOSFET are obtained.

In the above-mentioned processes, the peeling of the silicide electrode is not observed. As described above, according to this embodiment, the Pt-containing NiSi electrode and the Pt-containing Ni$_3$Si electrode are separately formed, and it is possible to obtain good complementary MOSFET characteristics by a combination of the electrodes and the HfSiON gate insulating film. In this way, it is possible to obtain a complementary MOSFET having a high performance, high reliability, and a relatively small manufacturing cost.

Fourth Embodiment

The final structure of a fourth embodiment of the invention is shown in FIG. 16C. This structure is characterized in that a NiSi or NiSi$_2$ electrode 27 is formed in an N-type MOSFET region and a Pt-containing Ni$_3$Si electrode 19 is formed in a P-type MOSFET region.

A semiconductor device according to the fourth embodiment includes a P-channel transistor and an N-channel transistor. The P-channel transistor is, for example, the semiconductor device according to the first embodiment, and the N-channel transistor has a gate electrode including a first metal silicide including a first metal material. In addition, the gate electrode of the N-channel transistor may have a second metal silicide including a second metal material and the second metal material.

A method of manufacturing the semiconductor device according to the fourth embodiment includes: a first step of forming a polysilicon layer (polysilicon film 5) on a silicon substrate 2 with a gate insulating film 4 interposed therebetween; a second step of patterning the polysilicon film 5; a step of forming a first metal layer including a first metal film 13 on the polysilicon film 5 and performing a heat treatment on the first metal layer at a predetermined temperature to form a gate electrode (NiSi or NiSi$_2$ electrode 27) including a first metal silicide containing a first metal material in a contact portion between the gate insulating film 4 and the polysilicon film 5; a step of removing the first metal film 13; and a step of patterning a hard mask 17 to expose a desired region on the NiSi or NiSi$_2$ electrode 27, forming a second metal layer including a second metal film 14 and another first metal film (the first metal film 15) in this order on the NiSi or NiSi$_2$ electrode 27, and performing a heat treatment on the second metal layer at a predetermined temperature to form a gate electrode (Pt-containing Ni$_3$Si electrode 19) including the first metal silicide containing the first metal material, and a second metal silicide containing a second metal material or the second metal material in a contact portion between the gate insulating film 4 and the Pt-containing Ni$_3$Si electrode 19.

It is preferable that the second metal silicide including the second metal material be a metal-rich silicide in which the composition ratio of the second metal material to silicon in the second metal silicide including the second metal material is greater than 1.

FIGS. 14A to 14E, FIGS. 15A to 15D, and FIGS. 16A to 16C are cross-sectional views illustrating a process of manufacturing the MOSFET structure according to the fourth embodiment of the invention. In this embodiment, after an insulating interlayer is formed, the insulating interlayer is polished and planarized. At the same time, a CMP (chemical mechanical polishing) technique capable of exposing an upper part of the gate electrode is performed to manufacture a MOSFET.

Figure 15A:
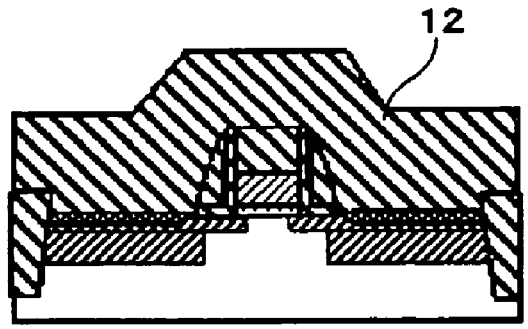
FIGS. 15A to 15D are cross-sectional views illustrating a portion of the process of manufacturing the semiconductor device according to the fourth embodiment of the invention.
Figure 15B:
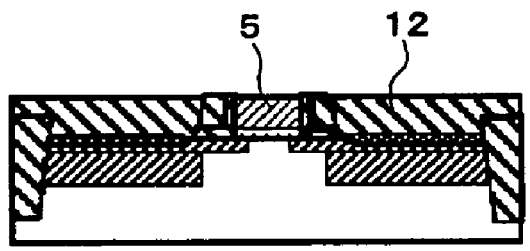

The processes shown in FIGS. 14A to 14E and FIGS. 15A to 15D are similarly performed on the N-type MOSFET and the P-type MOSFET. The processes shown in FIGS. 14A to 14E and FIGS. 15A and 15B are the same as those shown in FIGS. 4A to 4E and FIGS. 5A and 5B according to the first embodiment of the invention. As shown in FIG. 15B, the insulating interlayer 12 of the silicon oxide film formed by a CVD (chemical vapor deposition) method is planarized by a CMP technique, and the insulating interlayer 12 is etched to expose the polysilicon film 5 of the gate electrode.

Figure 15C:
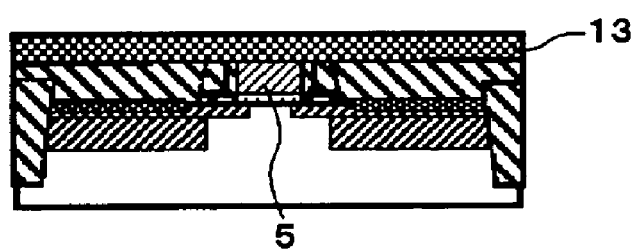

Then, as shown in FIG. 15C, in order to form silicide with the polysilicon film 5 having a gate electrode shape, the first metal film 13 is deposited. For example, a representative deposition method is a sputtering method or a chemical vapor deposition method. In this case, the first metal material may be selected from metal materials capable of forming silicide with the polysilicon film 5, such as Ni, Hf, V, Ti, Ta, W, Co, Cr, Zr, Mo, Nb, and alloys thereof. However, a metal material may be used which is capable of completely siliciding the polysilicon film 5 at a temperature at which the resistance value of the silicide layer 11 formed on the source/drain diffusion layer 9 is not increased any further.

In this embodiment, Ni is used as the first metal material. Ni is also used for the silicide layer 11 formed on the source/drain diffusion layer 9, and is relatively easily used to form silicide with the polysilicon film 5. However, other materials may be used without departing the scope of the invention. When a Ni monosilicide (NiSi) layer is formed on the source/drain diffusion layer 9, it is necessary to reduce the temperature of the subsequent process to 500° C. or less in order to prevent an increase in the contact resistance between the source/drain diffusion layer 9 and an interconnect line due to Ni disilicide (NiSi$_2$). In this embodiment, Ni that is sufficiently silicided at a temperature of 500° C. or less is used.

As known in the art, the thickness t1 of the first metal film 13 is an important factor for determining the silicide phase of the silicide gate electrode. In addition, the silicide phase of the silicide gate electrode is an important factor for determining the work function of the silicide gate electrode, which will be described below. According to the inventors' examination, it is preferable that the thickness t1 be three-fourths or less of the thickness of the polysilicon film 5. In this embodiment, a Ni film with a thickness of 42 nm is deposited.

After the first metal film 13 is deposited, the first metal material is diffused into the polysilicon film 5 on the gate insulating film 4, and a heat treatment is performed to generate silicidation reaction. The heat treatment needs to be performed in a non-oxydation atmosphere in order to prevent the oxidation of the first metal film 13. In addition, the heat treatment needs to be performed at a temperature at which a sufficiently high diffusion speed to completely silicide the polysilicon film 5 on the gate insulating film 4 is obtained and the silicide layer 11 formed on the source/drain diffusion layer 9 does not have a large resistance value.

In this embodiment, since both the silicide layer 11 formed on the source/drain diffusion layer 9 and the silicide formed on the gate electrode are made of Ni, the heat treatment needs to be performed at a temperature of 350° C. or more in a nitrogen gas atmosphere. In this embodiment, the heat treatment is performed at a temperature of 400° C. for 5 minutes. When the silicide formed on the source/drain diffusion layer 9 is Co silicide or Ti silicide, the allowable heat treatment temperature is increased to, for example, about 800° C. The heat treatment causes Ni to be diffused into the polysilicon film 5, thereby generating silicidation reaction. As a result, the polysilicon film 5 is silicided in the contact portion between the gate insulating film 4 and the NiSi or NiSi$_2$ electrode 27.

Then, X-ray diffraction (XRD) measurement is performed. As a result of the measurement, the composition ratio of Ni/(Ni+Si) in the silicide is about 0.5 (NiSi phase). Finally, the remaining Ni film that has not been subjected to silicidation reaction during the heat treatment is removed by a wet etching method using a sulfuric acid/hydrogen peroxide aqueous solution or nitrohydrochloric acid.

Figure 15D:
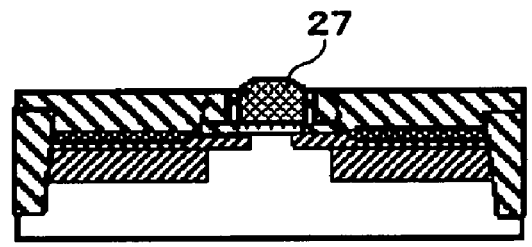
Figure 17A:
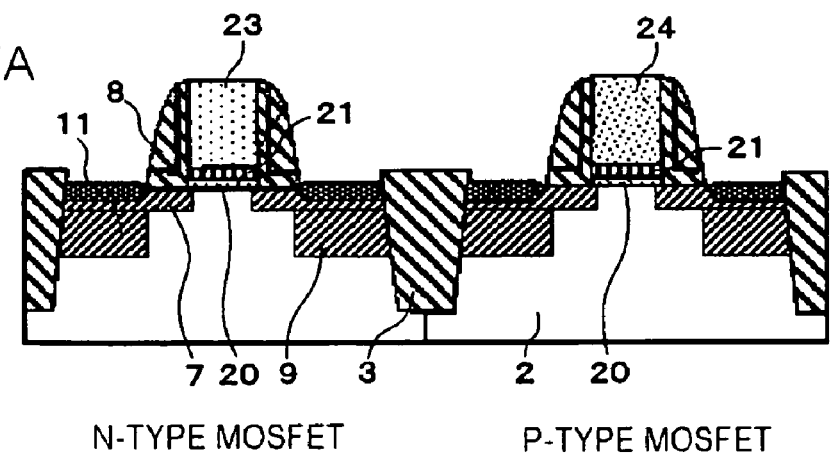
FIGS. 17A and 17B are cross-sectional views illustrating the structure of a semiconductor device according to the related art.
Figure 17B:
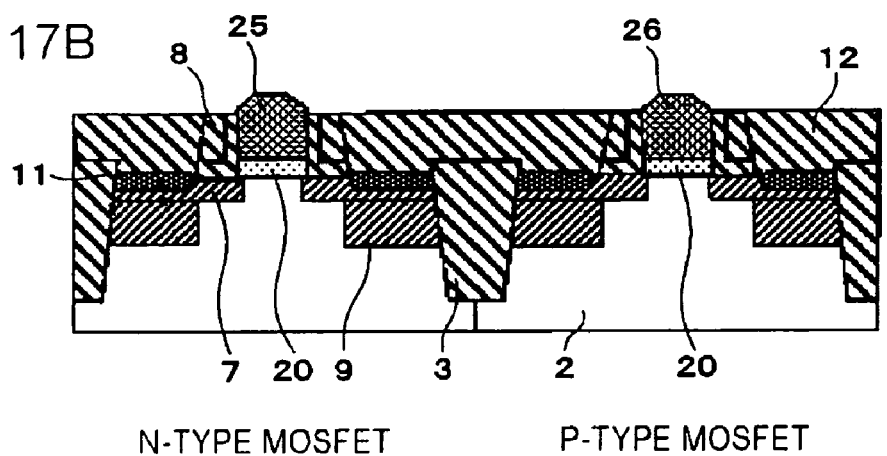
Figure 18A:
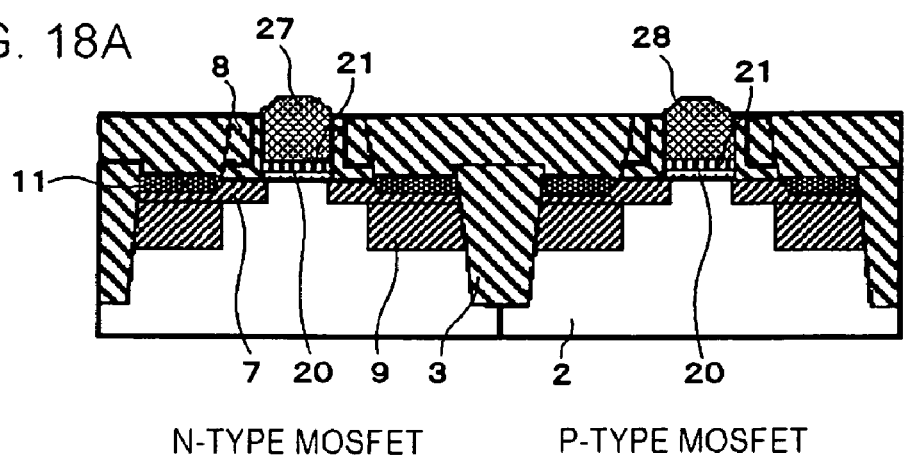
FIGS. 18A and 18B are cross-sectional views illustrating the structure of a semiconductor device according to the related art.
Figure 18B:
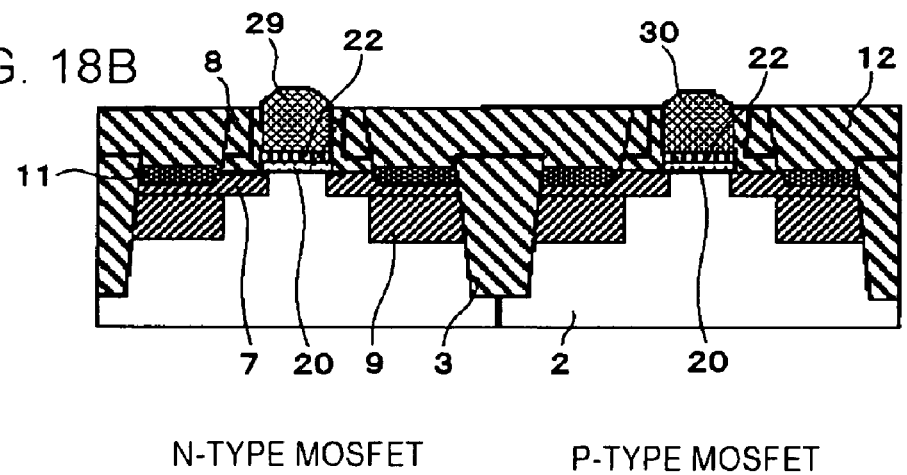

In the above-mentioned processes, the peeling of the silicide electrode is not observed. A MOSFET structure including the NiSi or NiSi$_2$ electrode 27 shown in FIG. 15D is formed by the above-mentioned processes.

Then, a process of increasing the content of Ni of the gate electrode in the P-type MOSFET region and introducing Pt to change the gate electrode into the Pt-containing Ni$_3$Si electrode 19 is performed. First, the hard mask 17 is deposited on the entire surface of the substrate. For example, a CVD method is suitable as the deposition method. It is preferable that the hard mask be made of a film that can be completely removed in the subsequent process, such as a silicon oxide film, a silicon nitride film, or other insulating films. It is preferable that the thickness of the hard mask be equal or greater than about 30 nm and equal to or less than about 100 nm.

Then, a lithography technique and an RIE (reactive ion etching) technique are used to pattern the hard mask 17 and etch only the P-type MOSFET region. Then, the second metal film 14 and the first metal film 15 are deposited (FIG. 16A). For example, a representative deposition method is a sputtering method or a chemical vapor deposition method. In this case, a Pt film with a thickness of equal to or more than about 1 nm to equal to or less than 30 nm is preferably used as the second metal film 14. In addition, a Ni film with a thickness of equal to or more than about 30 nm to equal to or less than 60 nm is preferably used as the first metal film 15.

After the second metal film 14 and the first metal film 15 are deposited, the second metal material in NiSi and the first metal material are diffused, and a heat treatment is performed to increase the content of Ni in the silicide and introduce Pt. The heat treatment needs to be performed in a non-oxydation atmosphere in order to prevent the oxidation of the second metal film 14 and the first metal film 15. In addition, the heat treatment needs to be performed at a temperature at which a sufficiently high diffusion speed to increase the content of Ni in the NiSi or NiSi$_2$ electrode 27 on the gate insulating film 4 is obtained and the silicide layer 11 formed on the source/drain diffusion layer 9 does not have a large resistance value.

In this embodiment, since both the silicide layer 11 formed on the source/drain diffusion layer 9 and the silicide formed on the gate electrode are made of Ni, the heat treatment is performed in a nitrogen gas atmosphere at a temperature of 450° C. for 5 minutes. When the silicide formed on the source/drain diffusion layer 9 is Co silicide or Ti silicide, the allowable heat treatment temperature is increased to, for example, about 800° C. The content of Ni in the NiSi or NiSi$_2$ electrode 27 is increased and Pt is selectively introduced into only the P-type MOSFET region by the heat treatment. As a result, the electrode is changed into the Pt-containing Ni$_3$Si gate electrode 19. Then, X-ray diffraction (XRD) measurement is performed. As a result of the measurement, the composition ratio of Ni/(Ni+Si) in the silicide is about 0.75 (Ni$_3$Si phase).

Finally, the remaining Ni and Pt films that have not been subjected to silicidation reaction during the heat treatment are removed by a wet etching method using a sulfuric acid/hydrogen peroxide aqueous solution or nitrohydrochloric acid (FIG. 16B). In addition, for example, selective etching is performed to remove the hard mask 17 to obtain a complementary MOSFET structure in which the NiSi or NiSi$_2$ electrode 27 is used as the gate electrode of an N-type MOSFET and the Pt-containing Ni$_3$Si electrode 19 is used as the gate electrode of a P-type MOSFET, as shown in FIG. 16C.

In the MOSFET structure including the Pt-containing Ni$_3$Si electrode 19 formed by the above-mentioned processes, the work function of the electrode is 4.92 eV, and characteristics suitable for the P-type MOSFET are obtained. In the MOSFET structure including the NiSi or NiSi$_2$ electrode 27, the work function of the electrode is 4.5 eV, and characteristics suitable for a transistor for a dynamic random access memory or a static random access memory requiring characteristics before and after the mid-gap are obtained.

A cap film made of a La oxide or a thin Al layer is provided in the contact portion between the NiSi or NiSi$_2$ electrode 27 and the gate insulating film 4. In this case, the work function is about in the range of 4.0 to 4.28 eV, and characteristics suitable for the N-type MOSFET are obtained. In the above-mentioned processes, the peeling of the silicide electrode is not observed. As described above, according to this embodiment, the NiSi electrode and the Pt-containing Ni$_3$Si electrode are separately formed, and it is possible to obtain good complementary MOSFET characteristics by a combination of the electrodes and a HfSiON gate insulating film. In this way, it is possible to obtain a complementary MOSFET having a high performance, high reliability, and a relatively small manufacturing cost.

According to the semiconductor devices of the first to fourth embodiments, the gate electrode using silicide as a base is used. Therefore, it is possible to prevent the gate electrode from being depleted and control the silicide formation conditions (temperature and composition) to increase the degree of control of the work function of the electrode on a high-dielectric-constant gate insulating film, which has not been achieved in the related art. As a result, it is possible to provide an appropriate threshold voltage to each device on the same chip. In addition, when a metal material, such as Ni, capable of being subjected to a low-temperature silicide process is selected, it is possible to prevent an increase in the resistance of a contact silicide film in a source/drain diffusion region. According to the manufacturing methods of the above-described embodiments, after the poly-Si electrode is formed on the gate insulating film, the electrode is not removed. Therefore, the surface of the gate insulating film is not exposed to a wet etchant or an organic solvent. Therefore, it is possible to manufacture a metal gate/high-dielectric-constant gate insulating film CMOS transistor having high reliability.

Although the embodiments of the invention have been described above, the concept of the semiconductor device according to the invention is not limited to the above-described embodiments, but it is possible to select other materials and structures without departing from the scope of the invention.

For example, a combination of two kinds of metal elements that are used for the gate electrode and are capable of being silicided is not limited to Ni and Pt, but any combination of materials may be used as long as it can obtain a desired effect. In particular, a combination of Ni and Pt can be used to improve the performance of the P-type MOSFET, but other combinations may be considered to improve the performance. In addition, in order to improve the performance of the N-type MOSFET, other combinations of metal materials may be used to obtain the same effect as that by the combination of Ni and Pt.

In addition, a third metal material other than two kinds of metal elements capable of being silicided may be used such that the gate electrode of the N-type MOSFET or the P-type MOSFET, or the gate electrodes of the two MOSFETs have a work function other than those of two kinds of metal electrodes capable of being silicided. For example, Al may be added to the Pt-containing Ni silicide gate electrode of only the N-type MOSFET. In this case, it is possible to make only the gate electrode of the N-type MOSFET have a low work function (to 4.28 eV) and obtain the optimal characteristics.

A combination of the metal element for siliciding the gate electrode and the metal element used for siliciding the source/drain diffusion layer needs to satisfy the conditions that poly-Si on the gate is silicided in a temperature range in which the quality of the silicide of the source/drain diffusion layer is not changed. In general, in the case of a metal material that is less likely to be silicided at a low temperature, when a heat treatment is performed on the metal material for a long time, it is possible to silicide the metal material. Therefore, it is possible to obtain a desired effect by adjusting the heat treatment temperature or time according to a combination of silicide metal elements. For example, it is possible to optimize the silicidation temperature to obtain a desired effect by, for example, replacing poly-Si on the gate with amorphous Si and adjusting the deposition temperature of a metal material to be silicided. These techniques may be appropriately combined, if necessary.

As described above, according to another aspect of the present invention, a method for manufacturing a semiconductor device is provided.

(22) In another embodiment of a method of manufacturing a semiconductor device, comprising:

forming a polysilicon layer on a substrate with a gate insulating film interposed therebetween;

patterning said polysilicon layer; and forming a metal layer including a first metal film and a second metal film on said polysilicon film and performing a heat treatment on said metal layer at a predetermined temperature to form a gate electrode including a first metal silicide including a first metal material, and a second metal silicide including a second metal material, or the second metal material in a contact portion between said gate insulating film and said polysilicon film, wherein said second metal silicide including said second metal material is a metal-rich silicide in which the composition ratio of said second metal material to silicon in said second metal silicide including said second metal is greater than 1.

(23) In another embodiment of the method of manufacturing a semiconductor device as set forth in (22), wherein, in said forming the gate electrode, said metal layer includes said second metal film and said first metal film formed in this order.

(24) In another embodiment of the method of manufacturing a semiconductor device as set forth in (22), wherein, in said forming the gate electrode, said metal layer includes said first metal film, said second metal film, and said first metal film formed in this order.

(25) In another embodiment of the method of manufacturing a semiconductor device as set forth in (22), wherein, in said forming the gate electrode, said metal layer includes said first metal film and said second metal film formed in this order.

(26) In another embodiment of the method of manufacturing a semiconductor device as set forth in (22), wherein, in said forming the gate electrode, said metal layer is an alloy film made of said first metal material and said second metal material.

(27) In another embodiment of the method of manufacturing a semiconductor device as set forth in (22), wherein, in said forming the gate electrode, said metal layer includes an alloy film made of said first metal material and said second metal material, and said first metal material formed in this order.

(28) In another embodiment of the method of manufacturing a semiconductor device as set forth in (22), further comprising:

after said forming the gate electrode, removing said first metal film and said second metal film; and patterning a hard mask to expose a desired region on said gate electrode and forming said metal layer including said first metal film on said gate electrode, and performing a heat treatment on said metal layer at a predetermined temperature to form a gate electrode including a first metal silicide containing a first metal material in a contact portion between said gate insulating film and said gate electrode.

(29) In another embodiment of a method of manufacturing a semiconductor device, comprising:

forming a polysilicon layer on a substrate with a gate insulating film interposed therebetween;

patterning said polysilicon film;

forming a first metal layer including a first metal film on said polysilicon film and performing a heat treatment on said first metal layer at a predetermined temperature to form a gate electrode including a first metal silicide including a first metal material in a contact portion between said gate insulating film and said polysilicon film;

removing said first metal film; and patterning a hard mask to expose a desired region on said gate electrode, forming a second metal layer including a second metal film on said gate electrode, and performing a heat treatment on said second metal layer at a predetermined temperature to form a gate electrode including a second metal silicide containing a second metal material, or the second metal material in a contact portion between said gate insulating film and said gate electrode, wherein said second metal silicide including said second metal material is a metal-rich silicide in which the composition ratio of said second metal material to silicon in said second metal silicide including said second metal is greater than 1.

(30) In another embodiment of the method of manufacturing a semiconductor device as set forth in (29), wherein, said step of forming the second metal layer includes, forming the second metal layer containing a second metal film and said first metal film in this order on said gate electrode, and performing a heat treatment on said second metal layer at a predetermined temperature to form a gate electrode including the first metal silicide containing the first metal material, and a second metal silicide containing a second metal material or the second metal material in a contact portion between said gate insulating film and said gate electrode, wherein said second metal silicide including said second metal material is a metal-rich silicide in which the composition ratio of said second metal material to silicon in said second metal silicide including said second metal material is greater than 1.

It is apparent that the present invention is not limited to the above embodiment, and may be modified and changed without departing from the scope and spirit of the invention.

What is claimed is:

1. A semiconductor device comprising:
   a substrate;
   a gate insulating film which is formed on said substrate; and
   a gate electrode which is provided on said gate insulating film,
   wherein at least a portion of said gate electrode that is in contact with said gate insulating film includes:
      a first metal silicide including a first metal material; and
      a second metal silicide including a second metal material, which is different from said first metal material, and
   wherein said second metal silicide including said second metal material comprises a metal-rich silicide in which a composition ratio of said second metal material to silicon in said second metal silicide including said second metal material is greater than 1.

2. The semiconductor device as set forth in claim 1, wherein the composition ratio of said second metal material to said silicon in said metal-rich silicide is equal to or greater than 3.

3. The semiconductor device as set forth in claim 1, further comprising:
   a source/drain region and an extension region.

4. The semiconductor device as set forth in claim 1, wherein said gate insulating film is selected from a metal oxide, a metal silicate, a high-dielectric-constant insulating film obtained by adding nitrogen to said metal oxide, and a high-dielectric-constant insulating film obtained by adding nitrogen to said metal silicate.

5. The semiconductor device as set forth in claim 4, wherein said high-dielectric-constant insulating film includes at least one of Hf and Zr.

6. The semiconductor device as set forth in claim 4, wherein said high-dielectric-constant insulating film includes one of a first film and a second film, said first film comprising one of a silicon oxide film and a silicon oxynitride film, said second film including at least one of Hf and Zr.

7. The semiconductor device as set forth in claim 4, wherein said high-dielectric-constant insulating film includes HfSiON.

8. The semiconductor device as set forth in claim 4, wherein a cap insulating film is formed on or below said high-dielectric-constant insulating film.

9. The semiconductor device as set forth in claim 8, wherein said cap insulating film comprises a metal oxide including a metal material selected from Al, La, and Mg.

10. The semiconductor device as set forth in claim 1, wherein a concentration of said second metal silicide including said second metal material or said second metal material in said gate electrode is increased from a surface of said gate electrode to the contact portion between said gate electrode and said gate insulating film.

11. The semiconductor device as set forth in claim 1, further comprising:
   two transistors each comprising one of said gate electrodes,
   wherein said two transistors have comprise different composition ratios of said first metal silicide including said first metal material, said second metal silicide including said second metal material, and said second metal material in said gate electrodes.

12. The semiconductor device as set forth in claim 1, wherein a concentration of silicon in said first metal silicide including said first metal material is higher than a concentration of the silicon in said second metal silicide including said second metal material.

13. The semiconductor device as set forth in claim 1, wherein said first metal material which is silicided comprises a material having a first silicide generation energy, and said second metal material comprises a material having a second silicide generation energy that is higher than the first silicide generation energy.

14. The semiconductor device as set forth in claim 1, wherein a work function of said second metal material is higher than that of said first metal material.

15. The semiconductor device as set forth in claim 1, wherein said first metal material is selected from Ni, Hf, V, Ti, Ta, W, Co, Cr, Zr, Mo, Nb, and alloys thereof.

16. The semiconductor device as set forth in claim 1, wherein said second metal material comprises Pt.

17. The semiconductor device as set forth in claim 16, wherein said second metal silicide including said second metal material comprises $Pt_3Si$.

18. The semiconductor device as set forth in claim 1, wherein said semiconductor device is comprises at least one of a P-channel transistor and an N-channel transistor.

19. The semiconductor device as set forth in claim 18, further comprising:
   said P-channel transistor; and
   said N-channel transistor,
   wherein a composition ratio of the first metal material to silicon of said first metal silicide including said first metal material in said N-channel transistor is lower than a composition ratio of the first metal material to said silicon of said first metal silicide including said first metal material in said P-channel transistor.

20. A semiconductor device comprising:
   a P-channel transistor; and
   an N-channel transistor,
   wherein said P-channel transistor comprises said semiconductor device as set forth in claim 1, and the N-channel transistor includes a second gate electrode comprising the first metal silicide containing said first metal material.

21. The semiconductor device as set forth in claim 20, wherein said N-channel transistor comprises a cell transistor of a dynamic random access memory.

22. The semiconductor device as set forth in claim 1, wherein said at least the portion of said gate electrode in contact with said gate insulating film includes said first metal silicide as a first metal silicide phase, and said second metal silicide as a second metal silicide phase or said second metal material as a second metal material phase.

* * * * *